(12) United States Patent
Ichinose

(10) Patent No.: US 9,754,884 B2
(45) Date of Patent: Sep. 5, 2017

(54) METHOD OF MANUFACTURING SEMICONDUCTOR DEVICE AND SEMICONDUCTOR DEVICE

(71) Applicant: Renesas Electronics Corporation, Tokyo (JP)

(72) Inventor: Kazuhito Ichinose, Hitachinaka (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/207,619

(22) Filed: Jul. 12, 2016

(65) Prior Publication Data

US 2017/0018502 A1    Jan. 19, 2017

(30) Foreign Application Priority Data

Jul. 14, 2015    (JP) ................. 2015-140307

(51) Int. Cl.
| | | |
|---|---|---|
| *H01L 23/48* | (2006.01) | |
| *H01L 23/528* | (2006.01) | |
| *H01L 21/768* | (2006.01) | |
| *H01L 23/532* | (2006.01) | |

(52) U.S. Cl.
CPC .... *H01L 23/5283* (2013.01); *H01L 21/76802* (2013.01); *H01L 21/76843* (2013.01); *H01L 21/76889* (2013.01); *H01L 21/76897* (2013.01); *H01L 23/53252* (2013.01)

(58) Field of Classification Search
CPC .......... H01L 23/5283; H01L 21/76897; H01L 23/53252
USPC ....................................... 257/751
See application file for complete search history.

(56) References Cited

U.S. PATENT DOCUMENTS

2015/0041960 A1    2/2015 Morii et al.

FOREIGN PATENT DOCUMENTS

| JP | 2013-222838 A | 10/2013 |
|---|---|---|
| JP | 2015-37099 A | 2/2015 |

*Primary Examiner* — Anthony Ho
(74) *Attorney, Agent, or Firm* — Sughrue Mion, PLLC

(57) ABSTRACT

Pretreatment is carried out in a first chamber. Then, a mixed gas of titanium tetrachloride and hydrogen is supplied into a second chamber. At this time, conditions are set such that partial pressure of the titanium tetrachloride is higher than 3 Pa. The conditions are set such that the product of the partial pressure of the titanium tetrachloride and supply time is greater than 800 Pa·second. The titanium tetrachloride continues to be supplied into the second chamber to form a titanium film under prescribed temperature conditions in a plasma atmosphere. The temperature conditions are set such that temperature is higher than temperature at which titanium silicide is formed and lower than temperature at which a metal silicide film agglomerates. A titanium nitride film is formed in a third chamber.

7 Claims, 42 Drawing Sheets

CONTACT RESISTANCE IN ELEMENT CONTACT PORTION
(METAL SILICIDE FILM)

METHOD OF MANUFACTURING SEMICONDUCTOR DEVICE AND SEMICONDUCTOR DEVICE

This nonprovisional application is based on Japanese Patent Application No. 2015-140307 filed on Jul. 14, 2015, with the Japan Patent Office, the entire contents of which are hereby incorporated by reference.

BACKGROUND OF THE INVENTION

Field of the Invention

The present invention relates to a method of manufacturing a semiconductor device and a semiconductor device, and can be suitably utilized, for example, for a semiconductor device including a contact portion with a semiconductor substrate and a contact portion with a metal silicide film.

Description of the Background Art

Some semiconductor devices include a substrate contact portion formed therein for fixing a semiconductor substrate (silicon) at a prescribed potential. In such a semiconductor device, a plurality of element formation regions are defined by an element isolation region, with the substrate contact portion disposed outside the element formation regions. This type of semiconductor device is disclosed in Patent Document 1 (Japanese Patent Laying-Open No. 2013-222838) and Patent Document 2 (Japanese Patent Laying-Open No. 2015-37099).

In the element formation regions, prescribed semiconductor elements such as a CMOS (Complementary Metal Oxide Semiconductor) transistor, a high breakdown voltage NMOS transistor and a high breakdown voltage PMOS transistor are formed. A metal silicide film is formed on source/drain regions and a gate electrode of each of the transistors such as the CMOS transistor.

An interlayer insulating film is formed to cover those semiconductor elements. A plurality of wires are formed on the surface of the interlayer insulating film. A predetermined one of the plurality of wires is electrically connected to the semiconductor substrate through the substrate contact portion. Another predetermined one of the plurality of wires is electrically connected to the metal silicide film of each semiconductor element through an element contact portion.

In the substrate contact portion, a plug is formed in a relatively deep contact hole extending from the surface of the interlayer insulating film and reaching the semiconductor substrate, with a barrier metal film interposed therebetween. In the element contact portion, a plug is formed in a relatively shallow contact hole extending from the surface of the interlayer insulating film and reaching the metal silicide film, with a barrier metal film interposed therebetween.

When forming the barrier metal film of the substrate contact portion, the barrier metal film is formed without carrying out pretreatment (reverse sputtering) on the deep contact hole. In contrast, when forming the barrier metal film of the element contact portion, the barrier metal film is formed after carrying out pretreatment on the shallow contact hole over the metal silicide film.

SUMMARY OF THE INVENTION

In a conventional semiconductor device, the substrate contact portion and the element contact portion have been formed in separate steps. This time the inventor simultaneously formed the substrate contact portion and the element contact portion, and found that variation in contact resistance resulted.

The other objects and new features will become apparent from the description of the present specification and the accompanying drawings.

A method of manufacturing a semiconductor device according to one embodiment includes the following steps. A metal silicide film is formed over a semiconductor substrate. An interlayer insulating film is formed over the semiconductor substrate to cover the metal silicide film. A first contact hole of a first depth is formed, the first contact hole penetrating the interlayer insulating film and reaching the metal silicide film. A second contact hole of a second depth deeper than the first depth is formed, the second contact hole penetrating the interlayer insulating film and reaching the semiconductor substrate. A barrier metal film is formed in each of the first contact hole and the second contact hole. A plug is formed to fill each of the first contact hole and the second contact hole. The step of forming a barrier metal film includes the steps of forming a first barrier metal film, and forming a second barrier metal film so as to be in contact with the first barrier metal film. The step of forming a first barrier metal film includes the steps of supplying a mixed gas of titanium tetrachloride ($TiCl_4$) and hydrogen ($H_2$) under such conditions that partial pressure of the titanium tetrachloride is 3 Pa or higher and the product of the partial pressure of the titanium tetrachloride and supply time is greater than 800 Pa·second, and forming a titanium film as the first barrier metal film in a plasma atmosphere using an inorganic source of titanium as a source material. In the step of forming a second barrier metal film, a metal nitride film is formed.

A semiconductor device according to another embodiment has a semiconductor substrate, a metal silicide film, an interlayer insulating film, an element contact portion, and a substrate contact portion. The element contact portion includes a barrier metal film first portion formed in a first contact hole of a first depth so as to be in contact with the metal silicide film, the first contact hole penetrating the interlayer insulating film and reaching the metal silicide film, and a plug first portion formed so as to be in contact with the barrier metal film first portion in such a manner as to fill the first contact hole. The substrate contact portion includes a barrier metal film second portion formed in a second contact hole of a second depth deeper than the first depth so as to be in contact with the semiconductor substrate, the second contact hole penetrating the interlayer insulating film and reaching the semiconductor substrate, and a plug second portion formed so as to be in contact with the barrier metal film second portion in such a manner as to fill the second contact hole. A film thickness of a portion of the barrier metal film first portion located at a bottom of the first contact hole is assumed to be L1. A film thickness of a portion of the barrier metal film first portion located at a sidewall of the first contact hole is assumed to be L2. A film thickness of a portion of the barrier metal film second portion located at a bottom of the second contact hole is assumed to be L3. A film thickness of a portion of the barrier metal film second portion located at a sidewall of the second contact hole is assumed to be L4. Relation between a ratio of film thickness L1 to film thickness L2 and a ratio of film thickness L3 to film thickness L4 is represented as film thickness L1/film thickness L2<film thickness L3/film thickness L4.

According to the method of manufacturing a semiconductor device in accordance with one embodiment, the element contact portion and the substrate contact portion can be simultaneously formed while variation in contact resistance is suppressed.

According to the semiconductor device in accordance with another embodiment, variation in contact resistance in each of the element contact portion and the substrate contact portion can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Here, an example of a semiconductor device is described in which a titanium film or the like is formed as a barrier metal film of a substrate contact portion and an element contact portion.

Figure 1:
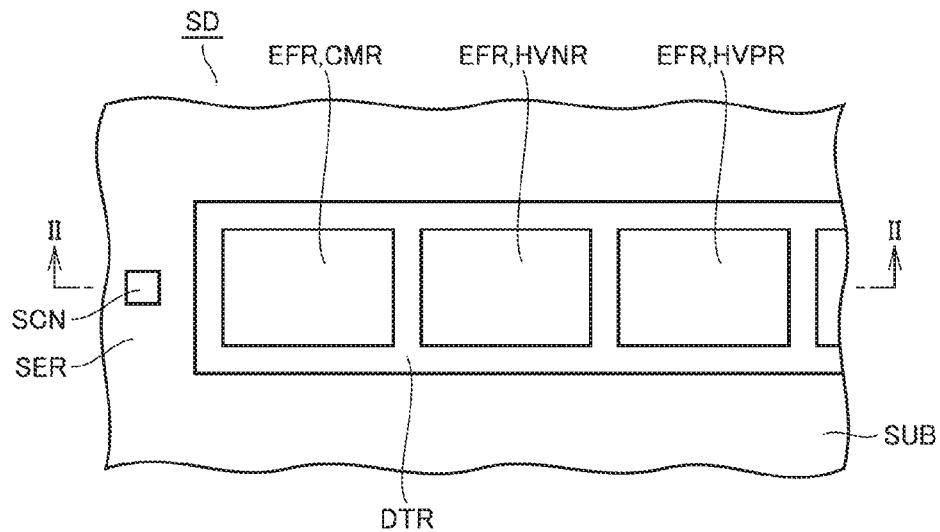
FIG. 1 is a fragmentary plan view of a semiconductor device according to each embodiment.
Figure 2:
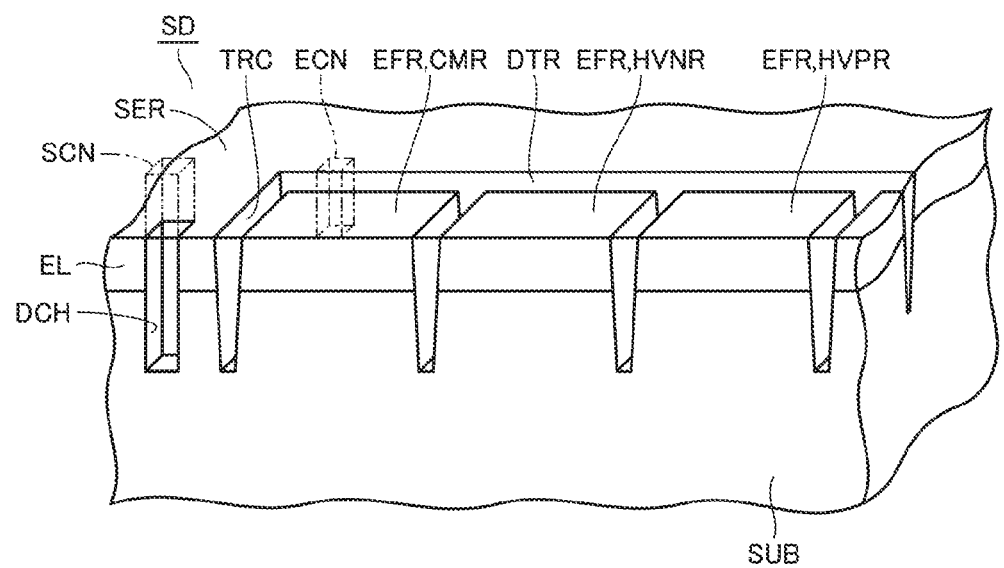
FIG. 2 is a fragmentary cross-sectional perspective view taken along a cross-sectional line II-II shown in FIG. 1, schematically showing the structure of the semiconductor device in each embodiment.

First, the outline of the structure of the semiconductor device is described. As shown in FIGS. 1 and 2, on the surface of an epitaxial layer EL formed on a semiconductor substrate SUB, a plurality of element formation regions EFR are defined by an element isolation region DTR. A CMOS transistor formation region CMR, a high breakdown voltage NMOS transistor formation region HVNR, a high breakdown voltage PMOS transistor formation region HVPR and the like, for example, are defined as the plurality of element formation regions EFR. In element formation regions EFR, element contact portions ECN are formed to be connected to a metal silicide film (not shown) formed on semiconductor elements such as an NMOS transistor and PMOS transistor. In element isolation region DTR, an insulating film (not shown) is formed in a relatively deep trench TRC penetrating epitaxial layer EL and reaching a prescribed position (depth) in semiconductor substrate SUB.

A substrate electrode region SER is defined outside of element formation regions EFR. A substrate contact portion SCN is formed at a prescribed position in substrate electrode region SER. Semiconductor substrate SUB is fixed at a prescribed potential through substrate contact portion SCN. Fixing the potential of semiconductor substrate SUB stabilizes the operation of the semiconductor elements such as an NMOS transistor and PMOS transistor. Substrate contact portion SCN is formed in a relatively deep contact hole DCH penetrating an interlayer insulating film (not shown) and epitaxial layer EL covering the semiconductor substrate and reaching a prescribed position (depth) in the semiconductor substrate. The outline of the structure of the semiconductor device is as described above.

Figure 3:
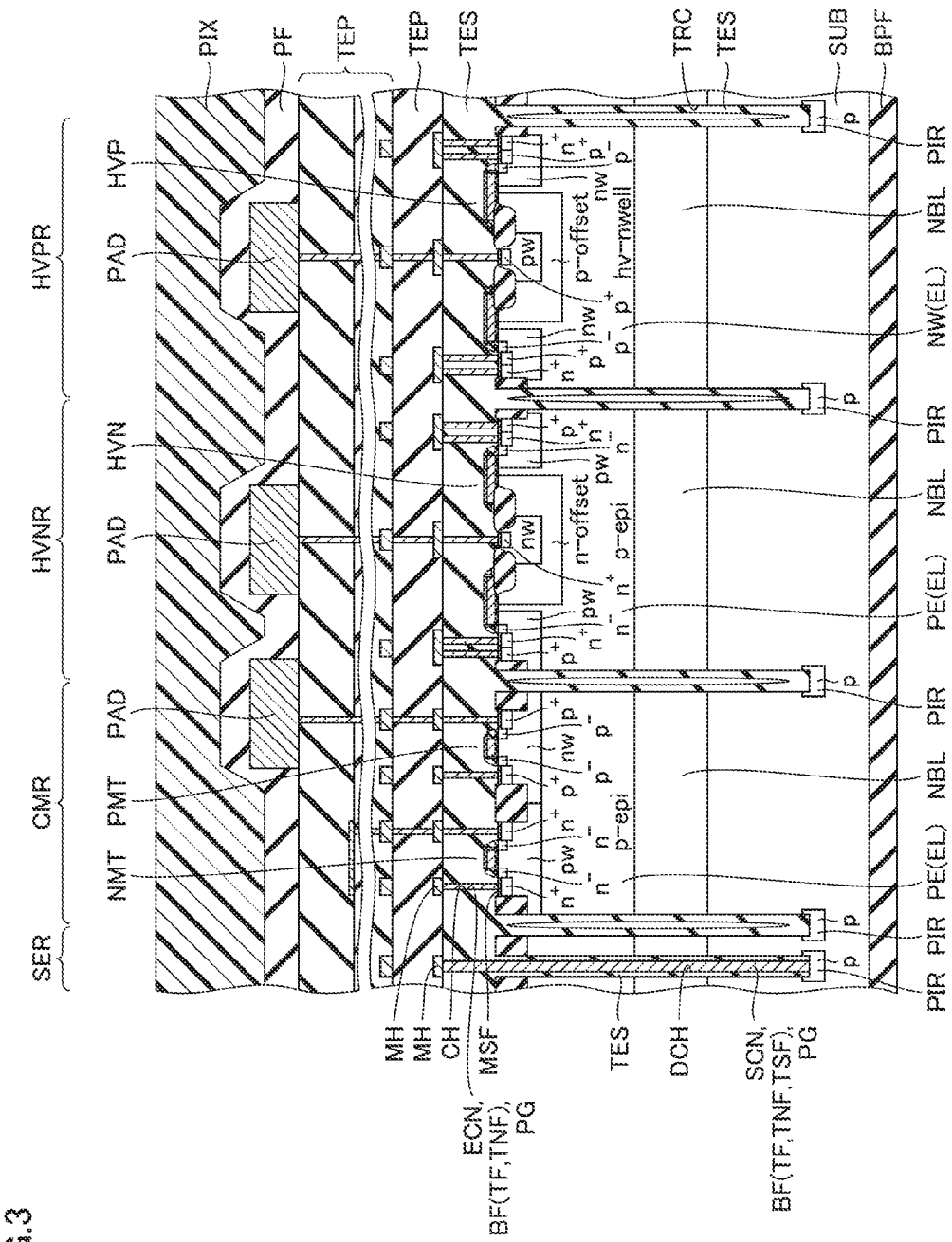
FIG. 3 is a cross-sectional view of a semiconductor device according to a first embodiment.

Next, the semiconductor device is described in detail. As shown in FIG. 3, an N type buried region NBL is formed to a prescribed depth from the surface of semiconductor substrate SUB. Epitaxial layer EL (a P type epitaxial layer PE and an N type well NW) is formed on the surface of N type buried region NBL.

An NMOS transistor NMT and a PMOS transistor PMT are formed in CMOS transistor formation region CMR. A high breakdown voltage NMOS transistor HVN is formed in high breakdown voltage NMOS transistor formation region HVNR. A high breakdown voltage PMOS transistor HVP is formed in high breakdown voltage PMOS transistor formation region HVPR.

A metal silicide film MSF is formed, for example, a cobalt silicide ($CoSi_2$) film is formed, on the surfaces of source/drain regions and the upper surface of a gate electrode of each transistor such as NMOS transistor NMT. A TEOS (Tetra Ethyl Ortho Silicate glass) oxide film TES is formed as an interlayer insulating film to cover the semiconductor elements including NMOS transistor NMT and the like.

In element formation region EFR, element contact portion ECN is formed in a contact hole CH penetrating TEOS oxide film TES and reaching metal silicide film MSF. In substrate electrode region SER, substrate contact portion SCN is formed in contact hole DCH penetrating TEOS oxide film TES, epitaxial layer EL and N type buried region NBL and reaching semiconductor substrate SUB.

Element contact portion ECN is formed of a barrier metal film BF and a plug PG. Substrate contact portion SCN is formed of barrier metal film BF and plug PG. The detailed structures of element contact portion ECN and substrate contact portion SCN will be described later.

A plurality of first wires MH are formed on the surface of TEOS oxide film TES. A predetermined one of the plurality of first wires MH is electrically connected to element contact portion ECN. Another predetermined one of the plurality of first wires MH is electrically connected to substrate contact portion SCN. An interlayer insulating film TEP is formed to cover first wires MH.

Another interlayer insulating film TEP is formed to cover interlayer insulating film TEP. Upper layer wires (not shown) are formed in the another interlayer insulating film TEP. Pads PAD are formed on the surface of interlayer insulating film TEP, and a passivation film PF is formed to cover pads PAD. A polyimide film PIX is formed to cover passivation film PF. A substantial part of the semiconductor device is configured as described above.

Next, the structures of element contact portion ECN and substrate contact portion SCN are described in detail.

Figure 4:
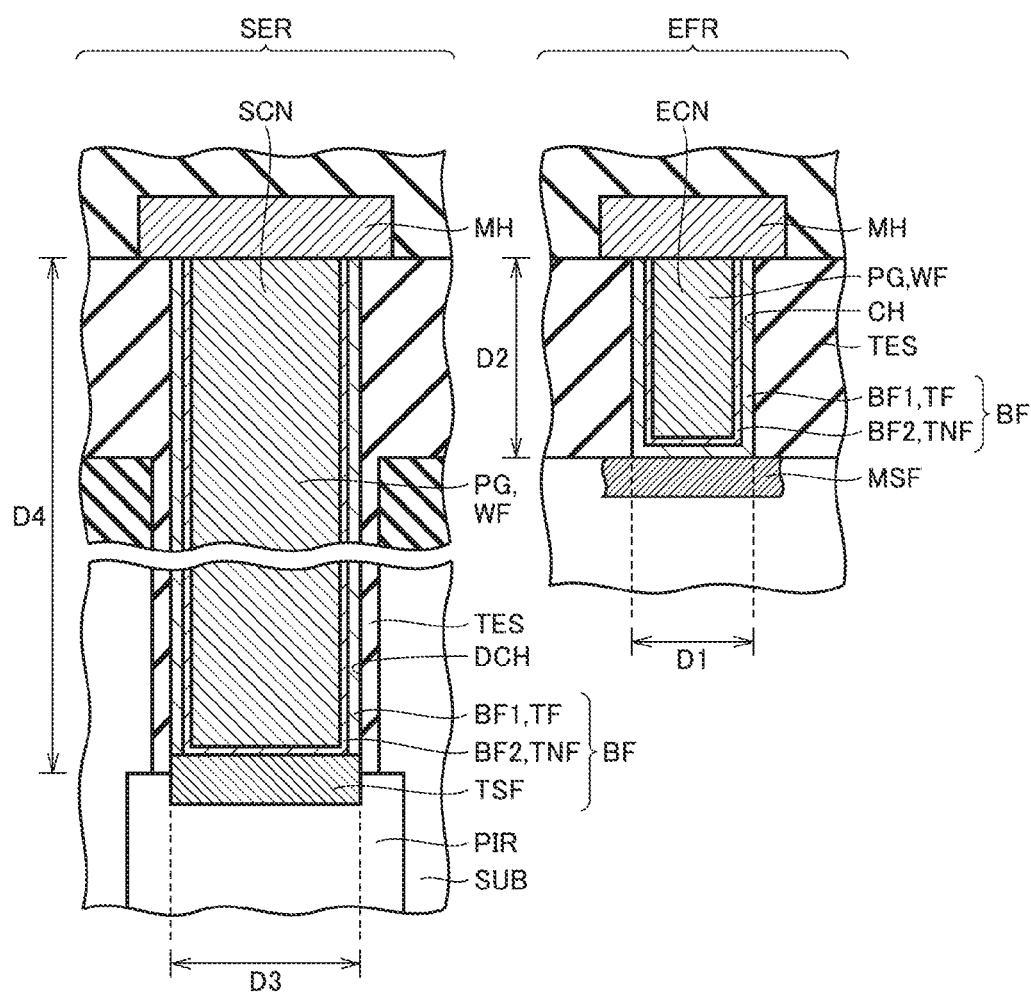
FIG. 4 is a fragmentary enlarged cross-sectional view showing a substrate contact portion and an element contact portion in the same embodiment.

As shown in FIGS. 3 and 4, element contact portion ECN is formed in relatively shallow contact hole CH. A depth D2 of shallow contact hole CH is about 0.5 μm, for example, and an opening dimension D1 of a bottom portion of contact hole CH is about 0.08 μm, for example. Thus, shallow contact hole CH has an aspect ratio (D2/D1) of about 6.25.

In contrast, substrate contact portion SCN is formed in relatively deep contact hole DCH. A depth D4 of deep contact hole DCH is about 15 μm, for example, and an opening dimension D3 of a bottom portion of contact hole DCH is about 0.5 μm, for example. Thus, deep contact hole DCH has an aspect ratio (D4/D3) of about 30.

In particular, as shown in FIG. 4, in element contact portion ECN, barrier metal film BF (barrier metal film first portion) is formed so as to be in contact with metal silicide film MSF in shallow contact hole CH. Barrier metal film BF is formed of a first barrier metal film BF1 (first barrier metal film first portion) and a second barrier metal film BF2 (second barrier metal film first portion). In this case, a titanium (Ti) film TF is formed as first barrier metal film BF1, and a titanium nitride (TiN) film TNF is formed as second barrier metal film BF2.

Titanium film TF is in contact with metal silicide film MSF. Titanium nitride film TNF is in contact with titanium film TF. Plug PG is formed to fill contact hole CH. Plug PG is formed of a tungsten film WF, for example, and is in contact with titanium nitride film TNF.

In substrate contact portion SCN, barrier metal film BF (barrier metal film second portion) is formed so as to be in contact with semiconductor substrate SUB (P type impurity region PIR) in deep contact hole DCH. Barrier metal film BF is formed of first barrier metal film BF1 (first barrier metal film second portion), second barrier metal film BF2 (second barrier metal film second portion) and a titanium silicide (TiSi$_2$) film TSF (third barrier metal film). Titanium (Ti) film TF is formed as first barrier metal film BF1, and titanium nitride (TiN) film TNF is formed as second barrier metal film BF2.

As will be described later, titanium film TF of element contact portion ECN and titanium film TF of substrate contact portion SCN are simultaneously formed. In addition, titanium nitride film TNF of element contact portion ECN and titanium nitride film TNF of substrate contact portion SCN are simultaneously formed. Titanium silicide film TSF of substrate contact portion SCN is a film formed by reaction between silicon (Si) of semiconductor substrate SUB and titanium (Ti) during the formation of titanium film TF.

Figure 5:
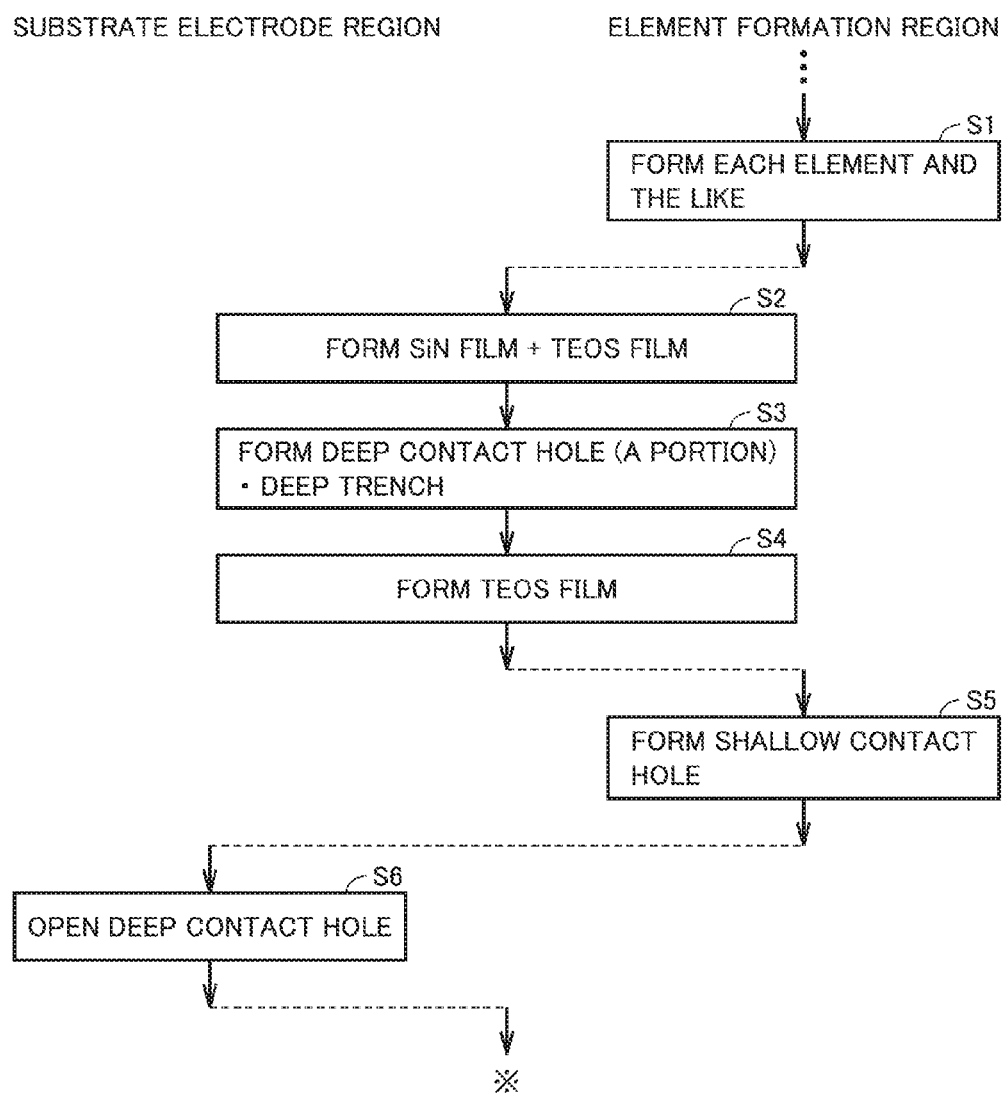
FIG. 5 is a first flowchart illustrating steps of manufacturing the semiconductor device in the same embodiment.

Next, an example of a method of manufacturing the above-discussed semiconductor device is described. A manufacturing flow is described first. As shown in FIG. 5, first, in step S1, each semiconductor element such as a transistor is formed in the element formation region by performing an implantation process, a photolithography process, an etching process, a film formation process and the like on semiconductor substrate SUB. At this time, a metal silicide film is formed on the surfaces of source/drain regions and the like of the transistor.

Then, in step S2, a silicon nitride film and a TEOS film which will serve as a mask for forming an opening and a trench are formed. Then, in step S3, a deep trench for defining the element formation region is formed with the TEOS film and the like as an etching mask. In the substrate electrode region, a portion of a deep contact hole reaching the semiconductor substrate is formed. Then, in step S4, a TEOS film is formed as an interlayer insulating film to cover the semiconductor element and the like.

Then, in step S5, a shallow contact hole is formed in the TEOS film. Then, in step S6, the deep contact hole is formed (opened) which is communicated with the partially formed contact hole penetrating the TEOS film. Consequently, in the element formation region, the relatively shallow contact hole penetrating the TEOS film and exposing the metal silicide film is opened. In the substrate electrode region, the relatively deep contact hole penetrating the TEOS film and the like and exposing the semiconductor substrate is opened.

Then, in step S7, a barrier metal film is simultaneously formed in the shallow contact hole and the deep contact hole. The step of forming this barrier metal film will be described later in detail with reference to the drawings. Then, in step S8, a tungsten film which will serve as a plug is formed in each of the shallow contact hole and the deep contact hole. Then, in step S9, a CMP (Chemical Mechanical Polishing) process is performed to form an element contact portion and a substrate contact portion. Subsequently, steps of forming wires and an interlayer insulating film and the like are performed, to thereby complete the substantial part of the semiconductor device.

Figure 7:
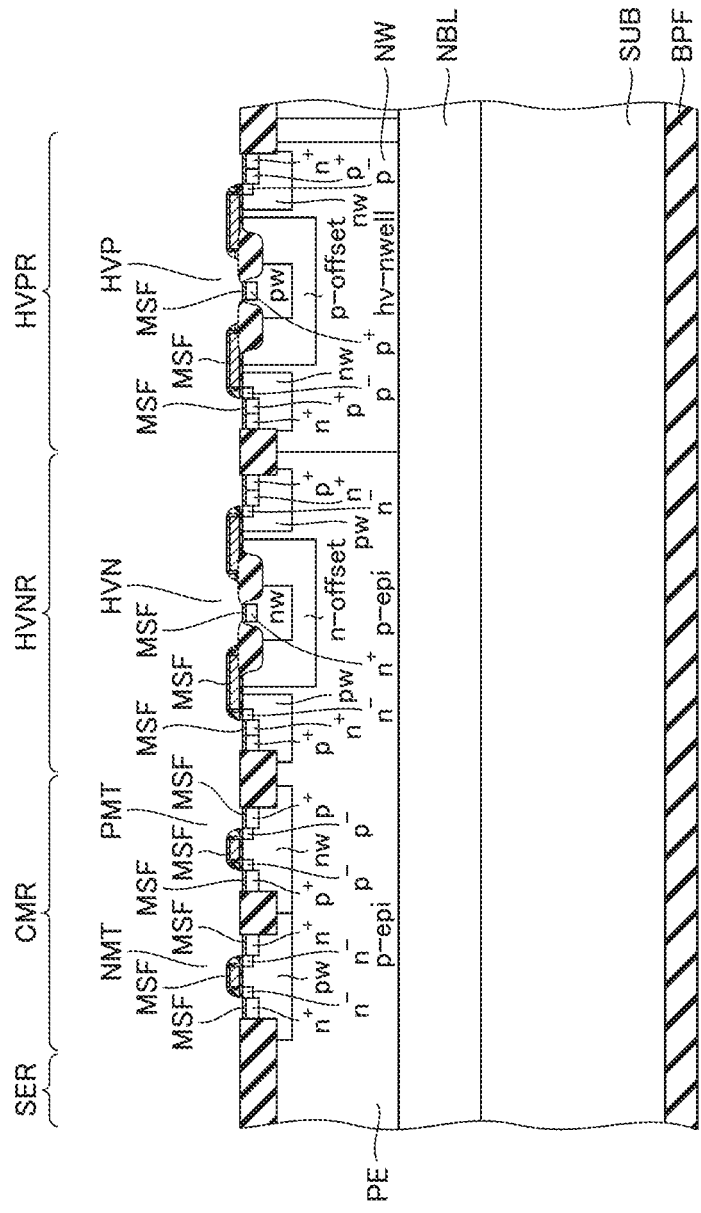
FIG. 7 is a cross-sectional view showing a step of a method of manufacturing the semiconductor device in the same embodiment.

Next, the steps of manufacturing the semiconductor device are described with reference to the drawings. As shown in FIG. 7, the semiconductor elements such as NMOS transistor NMT, PMOS transistor PMT, high breakdown voltage NMOS transistor HVN, and high breakdown voltage PMOS transistor HVP are formed (step S1). On the surfaces of the source/drain regions and the upper surface of the gate electrode of NMOS transistor NMT and the like, metal silicide film MSF such as a cobalt silicide film is formed by a self-aligned silicide process.

Figure 8:
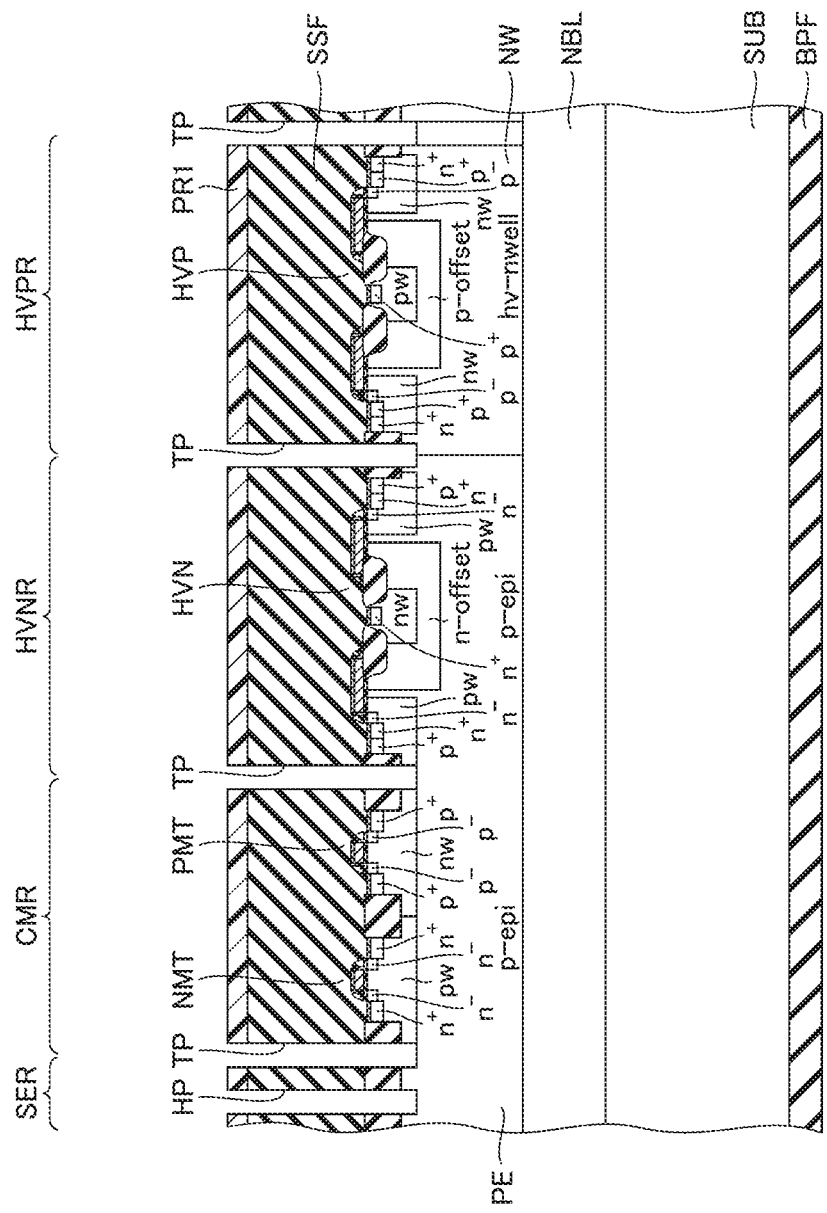
FIG. 8 is a cross-sectional view showing a step performed after the step shown in FIG. 7 in the same embodiment.

Then, as shown in FIG. 8, a silicon nitride film and a TEOS film SSF which will serve as an etching mask are formed to cover the semiconductor elements (step S2). Then, a photolithography process is performed to form a photoresist pattern PR1. Then, an etching process is performed on TEOS film SSF and the like with photoresist pattern PR1 as an etching mask, to form an opening TP reaching P type epitaxial layer PE and the like in the element formation region. An opening HP reaching P type epitaxial layer PE is formed in substrate electrode region SER.

Figure 9:
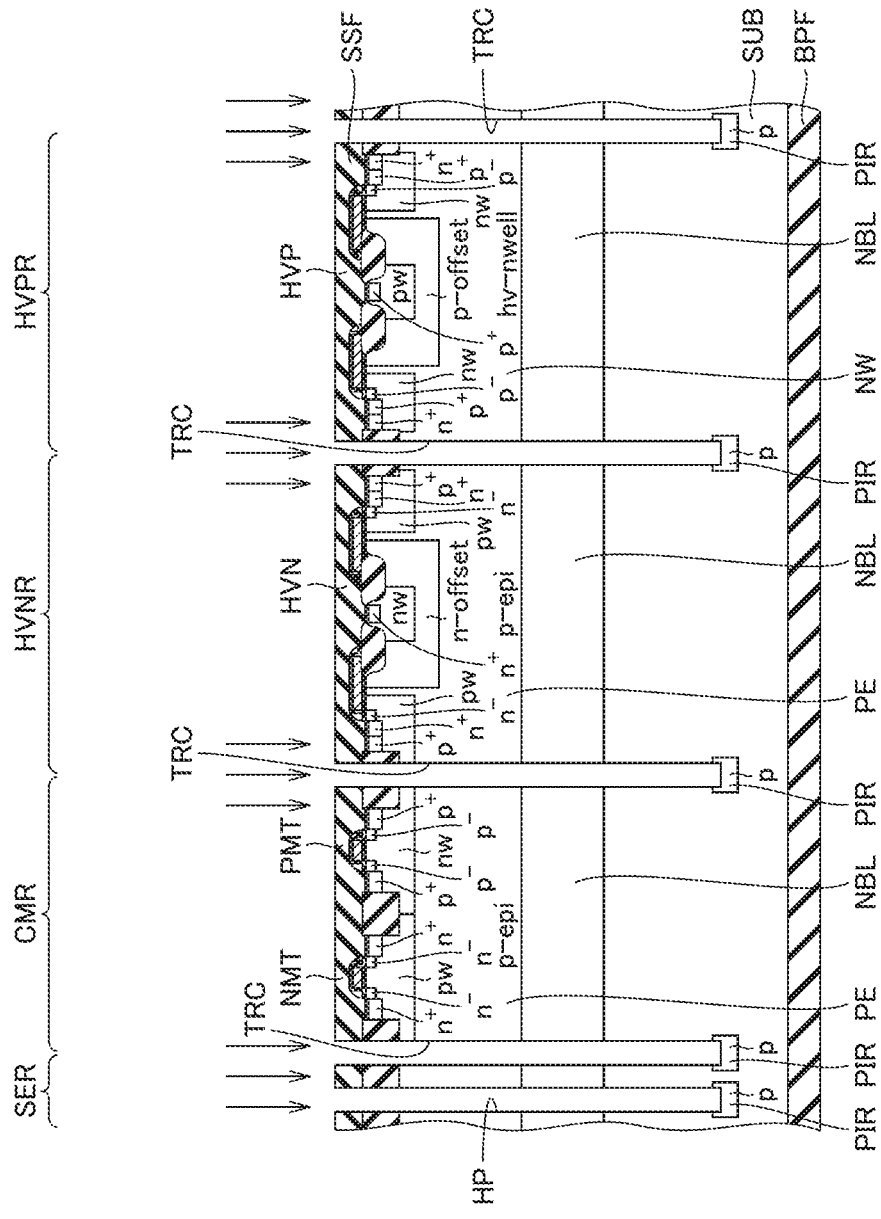
FIG. 9 is a cross-sectional view showing a step performed after the step shown in FIG. 8 in the same embodiment.

Then, an etching process is further performed on P type epitaxial layer PE now exposed, with TEOS film SSF and the like as an etching mask, to form deep trench TRC reaching semiconductor substrate SUB in element formation region EFR. Deep opening HP reaching semiconductor substrate SUB is formed in substrate electrode region SER. Then, as shown in FIG. 9, a P type impurity is implanted to form P type impurity region PIR in a bottom portion of each of trench TRC and opening HP. TEOS film SSF and the like are then removed.

Figure 10:
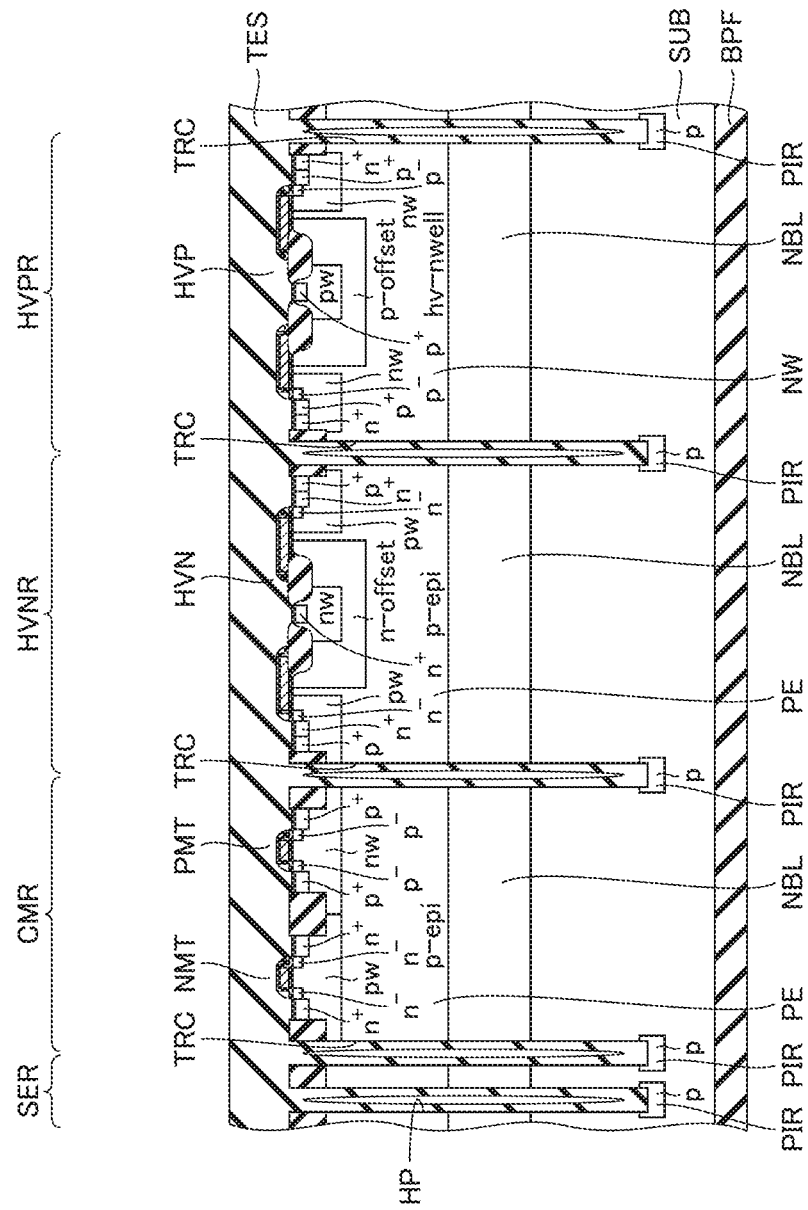
FIG. 10 is a cross-sectional view showing a step performed after the step shown in FIG. 9 in the same embodiment.

Then, as shown in FIG. 10, TEOS oxide film TES is formed as an interlayer insulating film to cover the semiconductor elements and the like (step S4). At this time, in element formation region EFR, TEOS oxide film TES is formed to cover the side surfaces and the bottom surface of trench TRC. In substrate electrode region SER, TEOS oxide film TES is formed to cover the side surfaces and the bottom surface of opening HP.

Figure 11:
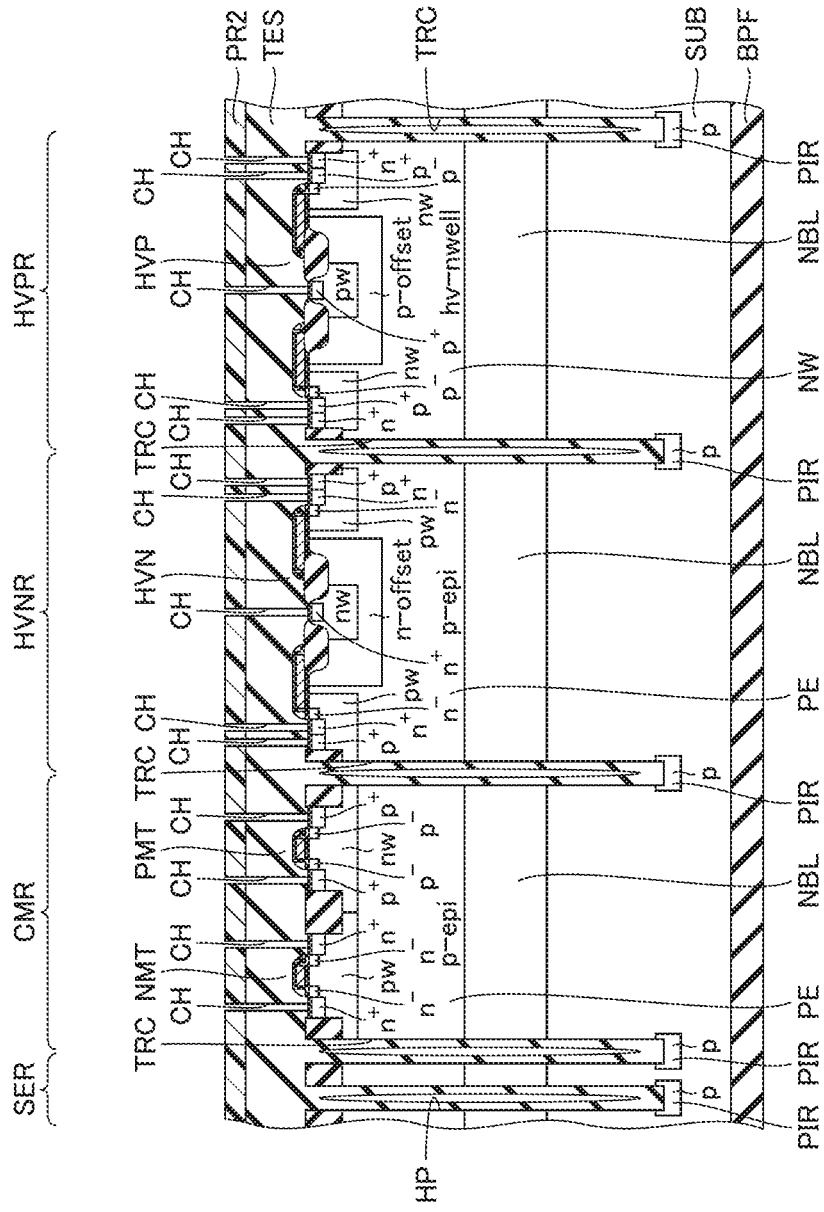
FIG. 11 is a cross-sectional view showing a step performed after the step shown in FIG. 10 in the same embodiment.

Then, as shown in FIG. 11, a photolithography process is performed to form a photoresist pattern PR2. Then, an etching process is performed on TEOS oxide film TES with photoresist pattern PR2 as an etching mask, to form shallow contact hole CH exposing metal silicide film MSF in element formation region EFR (step S5). Photoresist pattern PR2 is then removed.

Figure 12:
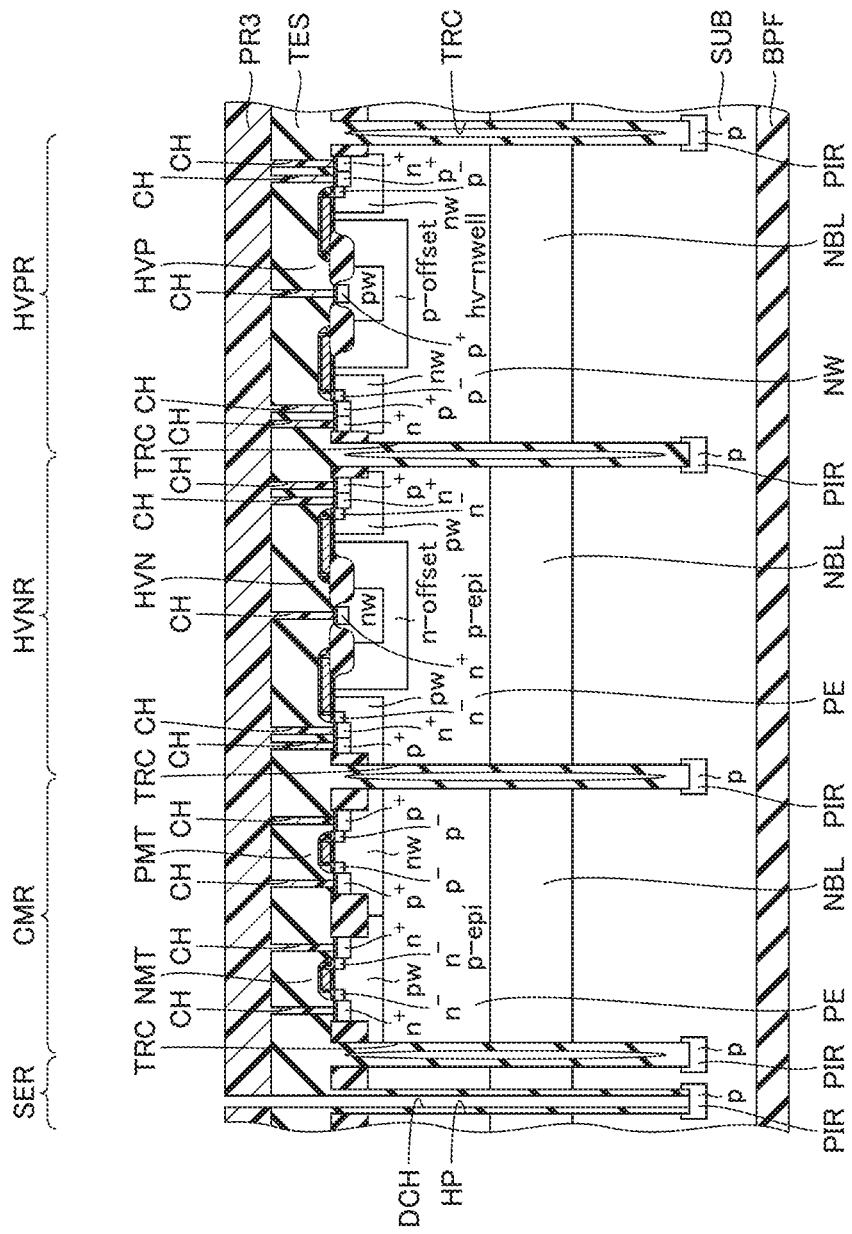
FIG. 12 is a cross-sectional view showing a step performed after the step shown in FIG. 11 in the same embodiment.

Then, as shown in FIG. 12, a photolithography process is performed to form a photoresist pattern PR3. Then, an etching process is performed on TEOS oxide film TES with photoresist pattern PR3 as an etching mask, to form deep contact hole DCH communicated with opening HP and exposing semiconductor substrate SUB (P type impurity region PIR) (step S6). Photoresist pattern PR3 is then removed.

Consequently, in element formation region EFR, shallow contact hole CH (D1: about 0.08 µm, D2: about 0.5 µm) is formed in which the element contact portion will be formed. In substrate electrode region SER, deep contact hole DCH (D3: about 0.5 µm, D4: about 15 µm) is formed in which the substrate contact portion will be formed (see FIG. 13).

Figure 6:
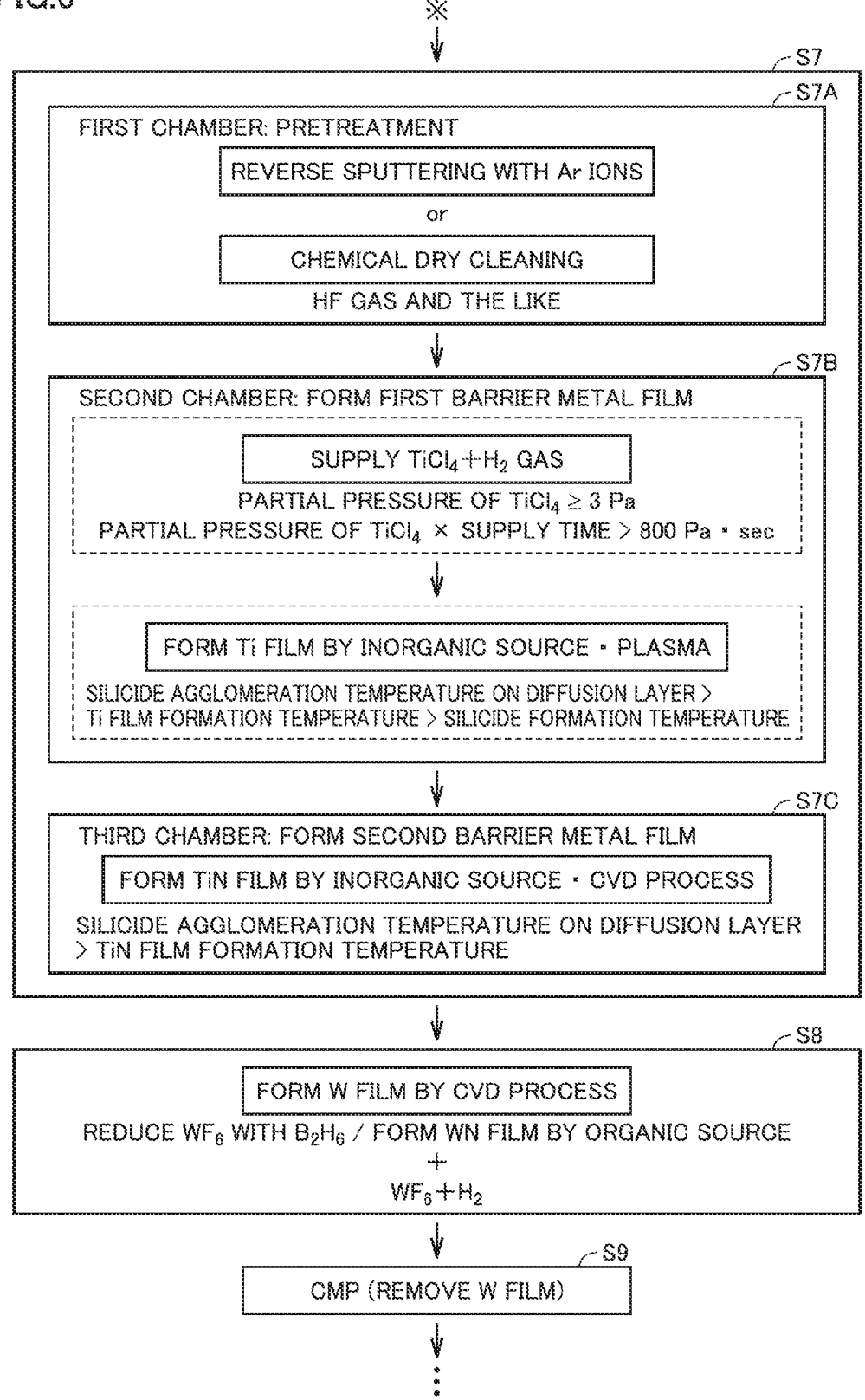
FIG. 6 is a second flowchart showing steps of forming the substrate contact portion and the element contact portion, which are performed after the steps of the first flowchart shown in FIG. 5 in the same embodiment.
Figure 13:
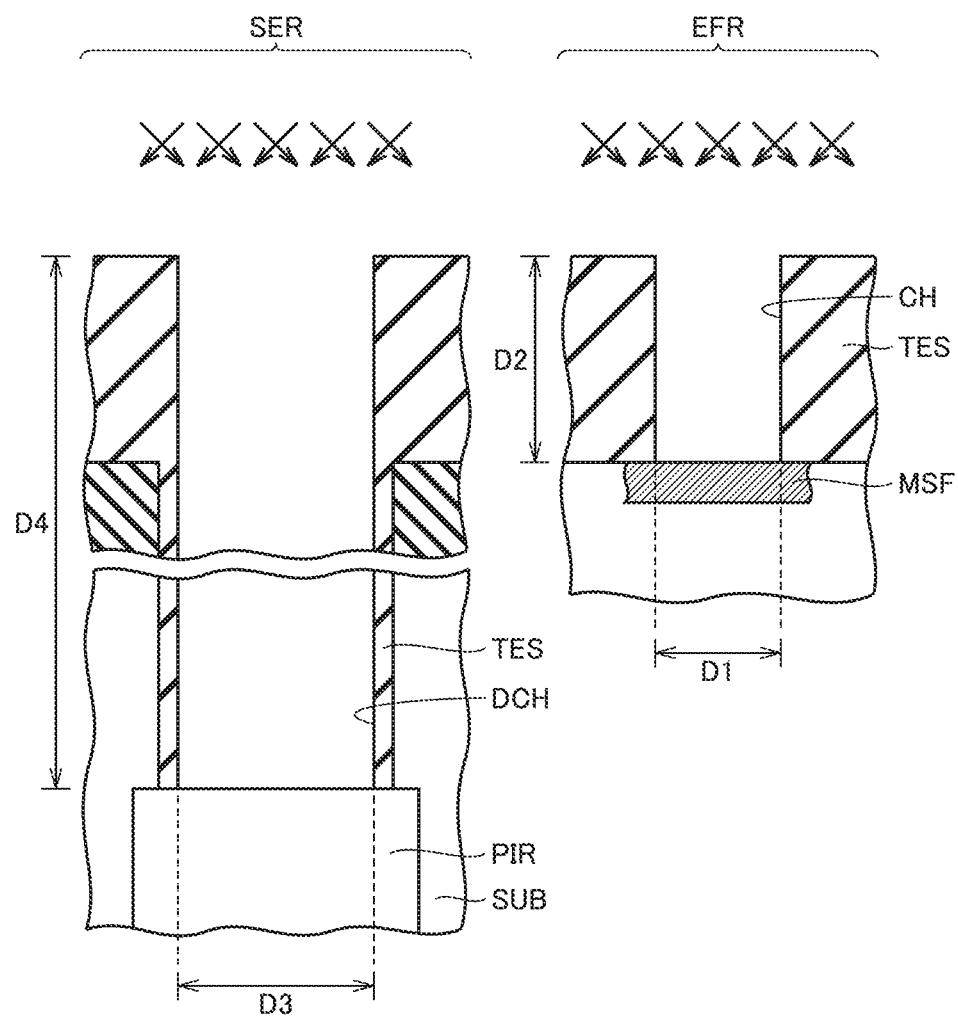
FIG. 13 is a fragmentary enlarged cross-sectional view showing a step performed after the step shown in FIG. 12 in the same embodiment.

Then, a barrier metal film is simultaneously formed in shallow contact hole CH and deep contact hole DCH (step S7). First, a wafer (semiconductor substrate) is transferred into a first chamber (not shown). Pretreatment is carried out in the first chamber (see step S7A in FIG. 6). As shown in FIG. 13, reverse sputtering with Ar ions or chemical dry cleaning with HF gas and the like is performed.

At this time, when reverse sputtering with Ar ions is to be performed, conditions are set such that knock-on does not occur in semiconductor substrate SUB by sputter etching with Ar ions. When chemical dry etching is to be performed, conditions are set such that semiconductor substrate SUB is not etched by chemical dry cleaning.

Then, the wafer (semiconductor substrate) that has been subjected to the pretreatment is transferred from the first chamber to a second chamber (not shown). In the second chamber, a titanium (Ti) film is formed as the first barrier metal film (see step S7B in FIG. 6). First, a mixed gas of titanium tetrachloride (TiCl$_4$) and hydrogen (H$_2$) is supplied as an inorganic source into the second chamber. At this time, conditions are set such that partial pressure of the titanium tetrachloride is higher than 3 Pa. The conditions are also set such that the product of the partial pressure of the titanium tetrachloride and supply time is greater than 800 Pa·second.

Here, the partial pressure of the titanium tetrachloride is desirably set to be higher than 3 Pa and lower than 8 Pa, and more preferably set to be higher than 4 Pa and lower than 7 Pa. The supply time is desirably longer than 90 seconds and shorter than 240 seconds, and more preferably longer than 120 seconds and shorter than 180 seconds.

Figure 14:
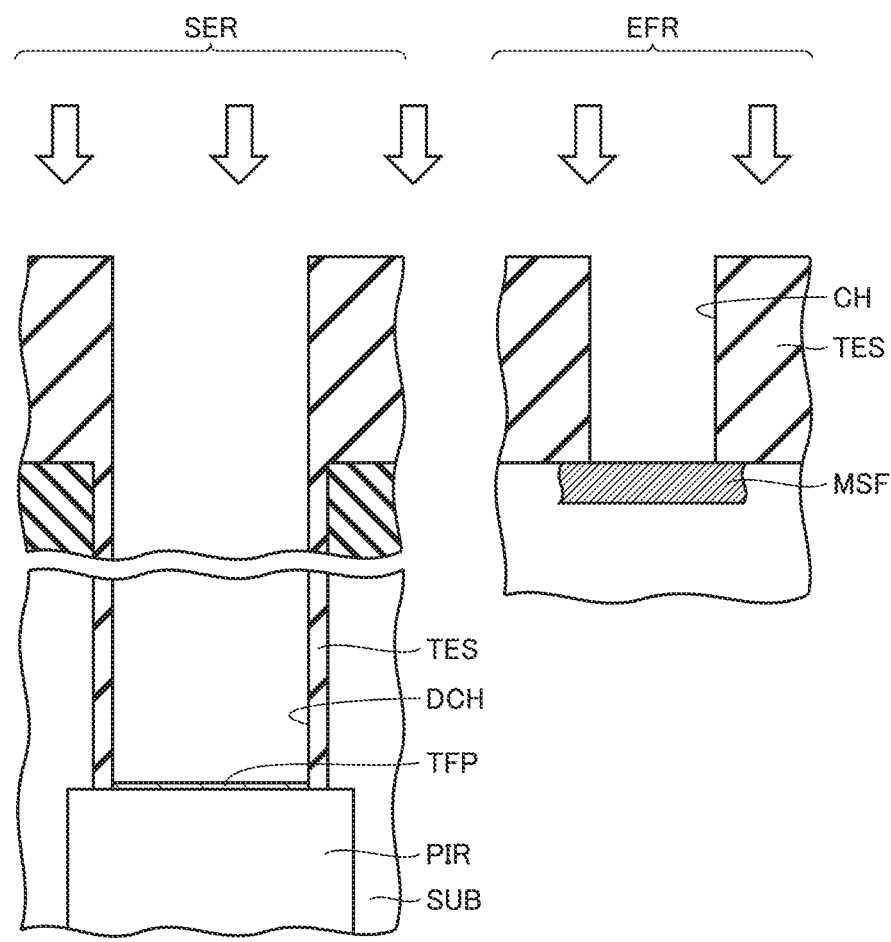
FIG. 14 is a fragmentary enlarged cross-sectional view showing a step performed after the step shown in FIG. 13 in the same embodiment.

As shown in FIG. 14, the supply of the mixed gas of titanium tetrachloride and hydrogen causes a thin titanium film TFP of about 5 nm, for example, to be selectively formed on the surface of semiconductor substrate SUB (P type impurity region PIR) exposed at the bottom of deep contact hole DCH. In contrast, a titanium film is not formed on the surface of metal silicide film MSF exposed at the bottom of shallow contact hole CH.

Then, titanium tetrachloride ($TiCl_4$), for example, continues to be supplied into the second chamber as an inorganic source of titanium, to form a titanium film under prescribed temperature conditions in a plasma atmosphere. The temperature conditions are set such that the temperature is higher than temperature at which titanium silicide is formed and lower than temperature at which metal silicide film MSF (cobalt silicide) agglomerates.

Figure 15:
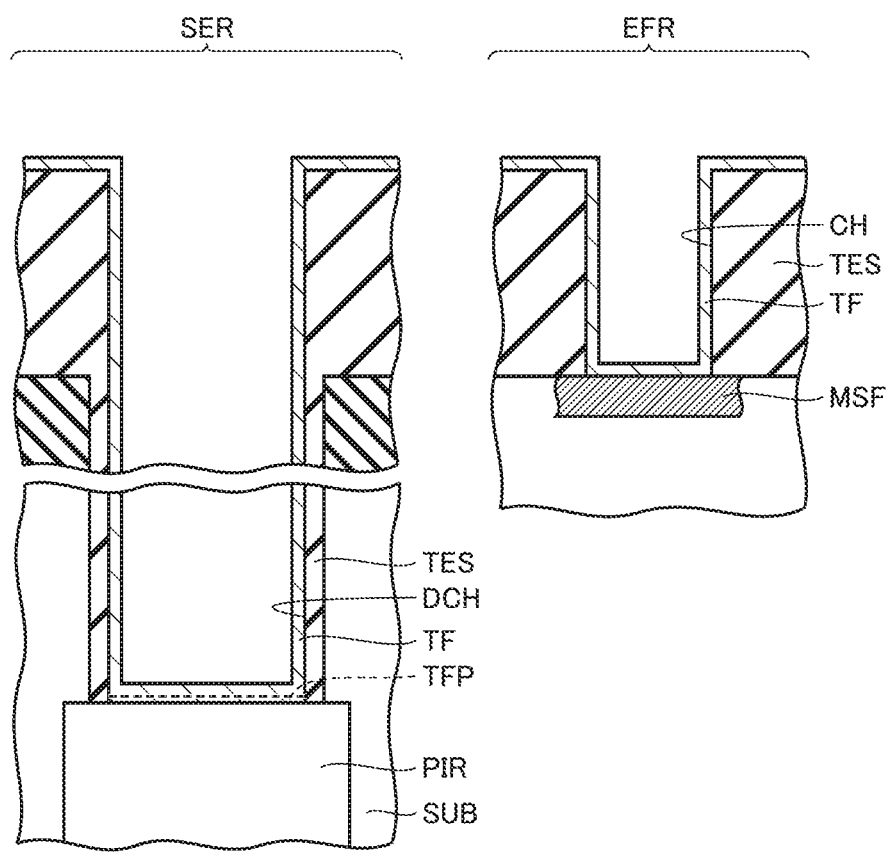
FIG. 15 is a fragmentary enlarged cross-sectional view showing a step performed after the step shown in FIG. 14 in the same embodiment.

Consequently, as shown in FIG. 15, titanium film TF of about 15 nm, for example, is formed on the side surfaces of shallow contact hole CH and the surface of metal silicide film MSF. Titanium film TF of about 15 nm is formed on the side surfaces of deep contact hole DCH.

Here, the titanium film having a film thickness of about 20 nm (5 nm+15 nm) will remain at the bottom of deep contact hole DCH unless silicidation occurs (see FIG. 15). At the bottom of deep contact hole DCH, however, the titanium (Ti) deposited is in contact with semiconductor substrate SUB (P type impurity region PIR). In addition, the titanium film has been formed at the temperature higher than temperature at which titanium silicide is formed.

Figure 16:
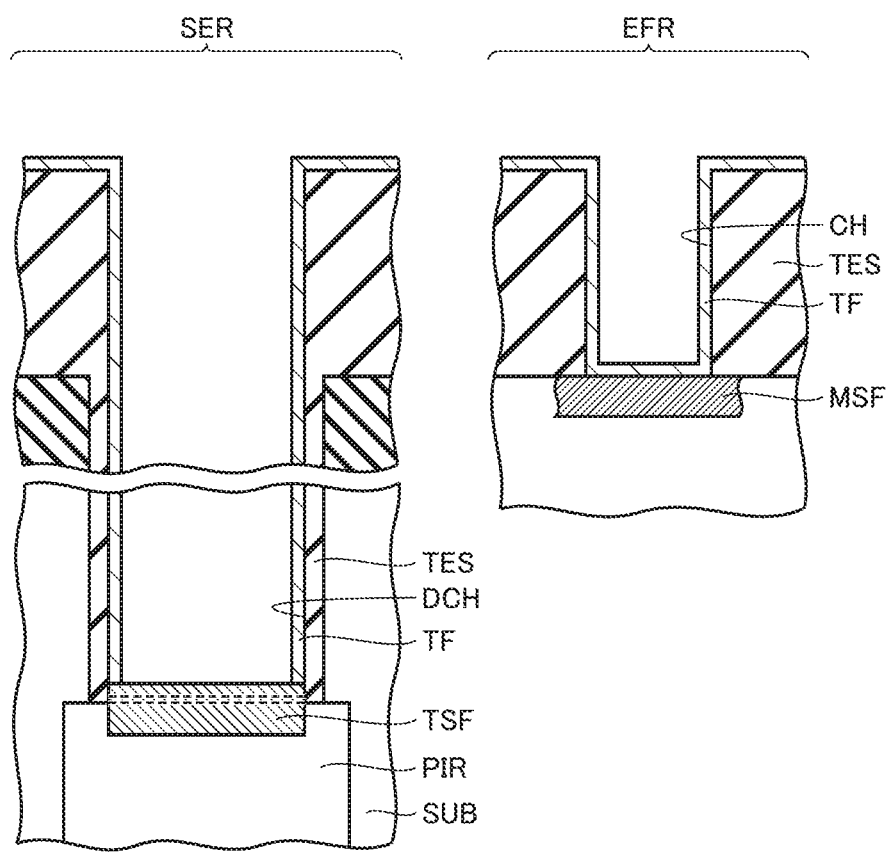
FIG. 16 is a fragmentary enlarged cross-sectional view showing a step performed after the step shown in FIG. 15 in the same embodiment.

Accordingly, as shown in FIG. 16, the titanium (Ti) reacts with the silicon (Si) in semiconductor substrate SUB to form a titanium silicide ($TiSi_2$) film. Stoichiometrically, titanium film TF having a film thickness of about 20 nm becomes titanium silicide film TSF having a film thickness of about 60 nm (20 nm×3) by the silicidation. In this manner, in deep contact hole DCH, titanium film TF is formed as the first barrier metal film and titanium silicide film TSF is formed as the third barrier metal film.

Then, the wafer (semiconductor substrate) now having titanium film TF and the like is transferred from the second chamber to a third chamber (not shown). In the third chamber, a titanium nitride (TiN) film is formed as the second barrier metal film (see step S7C in FIG. 6). The titanium nitride film is formed by a CVD (Chemical Vapor Deposition) process under prescribed temperature conditions, with a supply of titanium tetrachloride ($TiCl_4$) and ammonia ($NH_3$) as an inorganic source into the third chamber. The temperature conditions are set such that the temperature is higher than temperature at which a titanium nitride film is formed and lower than temperature at which metal silicide film MSF (cobalt silicide film) agglomerates.

Figure 17:
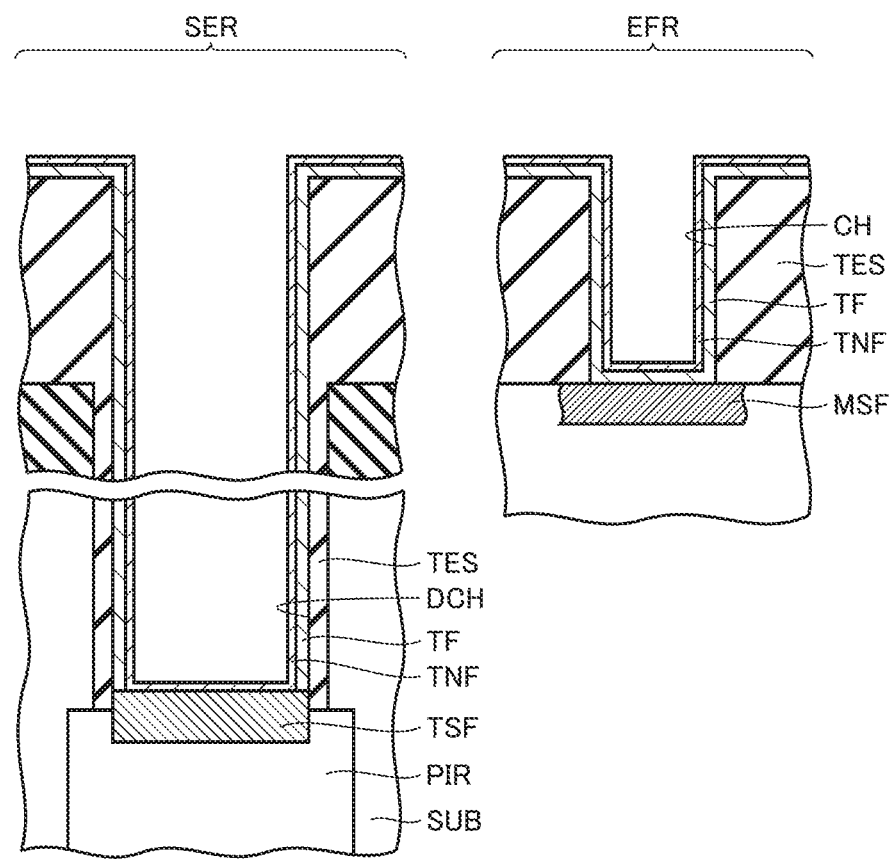
FIG. 17 is a fragmentary enlarged cross-sectional view showing a step performed after the step shown in FIG. 16 in the same embodiment.

Consequently, as shown in FIG. 17, in shallow contact hole CH, titanium nitride film TNF having a film thickness of about 10 nm, for example, is formed so as to be in contact with titanium film TF. In deep contact hole DCH, titanium nitride film TNF having a film thickness of about 10 nm is formed so as to be in contact with titanium film TF and titanium silicide film TSF.

Then, the wafer (semiconductor substrate) now having titanium nitride film TNF is transferred from the third chamber to a tungsten film deposition apparatus (not shown). In a chamber of the tungsten film deposition apparatus, a tungsten seed film is formed first. The seed film is formed with, for example, a method of reducing tungsten hexafluoride ($WF_6$) with diborane ($B_2H_6$), or a method of forming a tungsten nitride (WN) film using an organic source.

Figure 18:
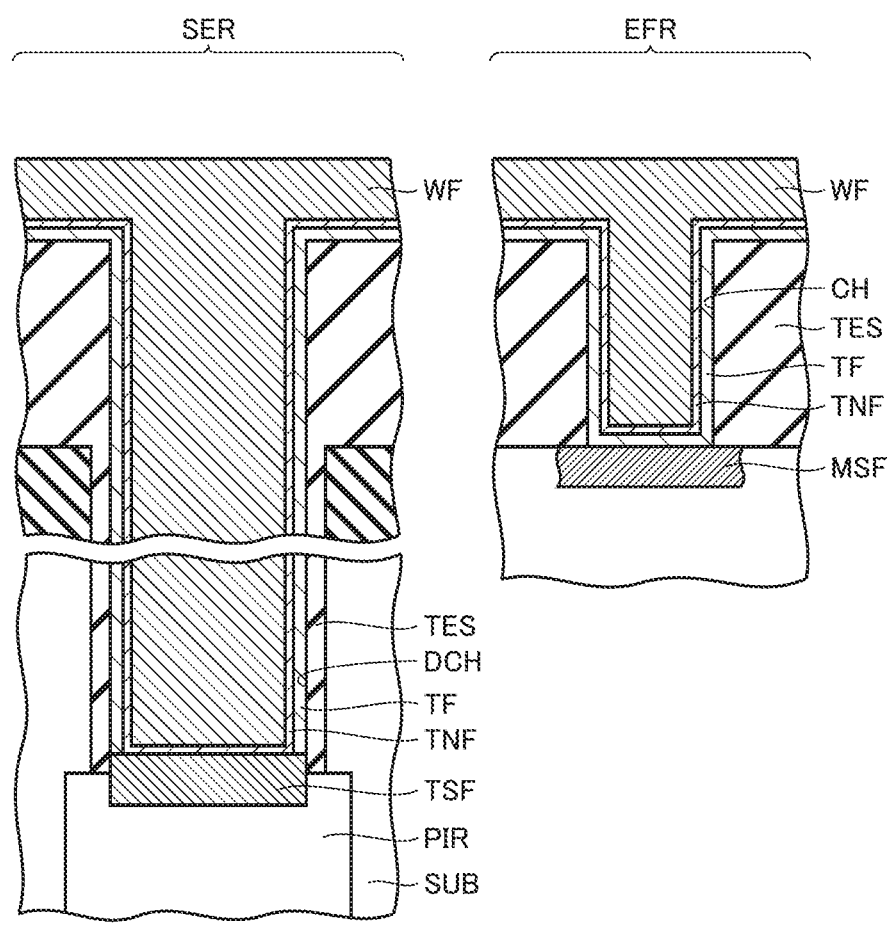
FIG. 18 is a fragmentary enlarged cross-sectional view showing a step performed after the step shown in FIG. 17 in the same embodiment.

Then, tungsten hexafluoride ($WF_6$) and hydrogen ($H_2$) are supplied to form a tungsten film as a bulk. Consequently, as shown in FIG. 18, tungsten film WF is formed to fill shallow contact hole CH and tungsten film WF is formed to fill deep contact hole DCH.

Figure 19:
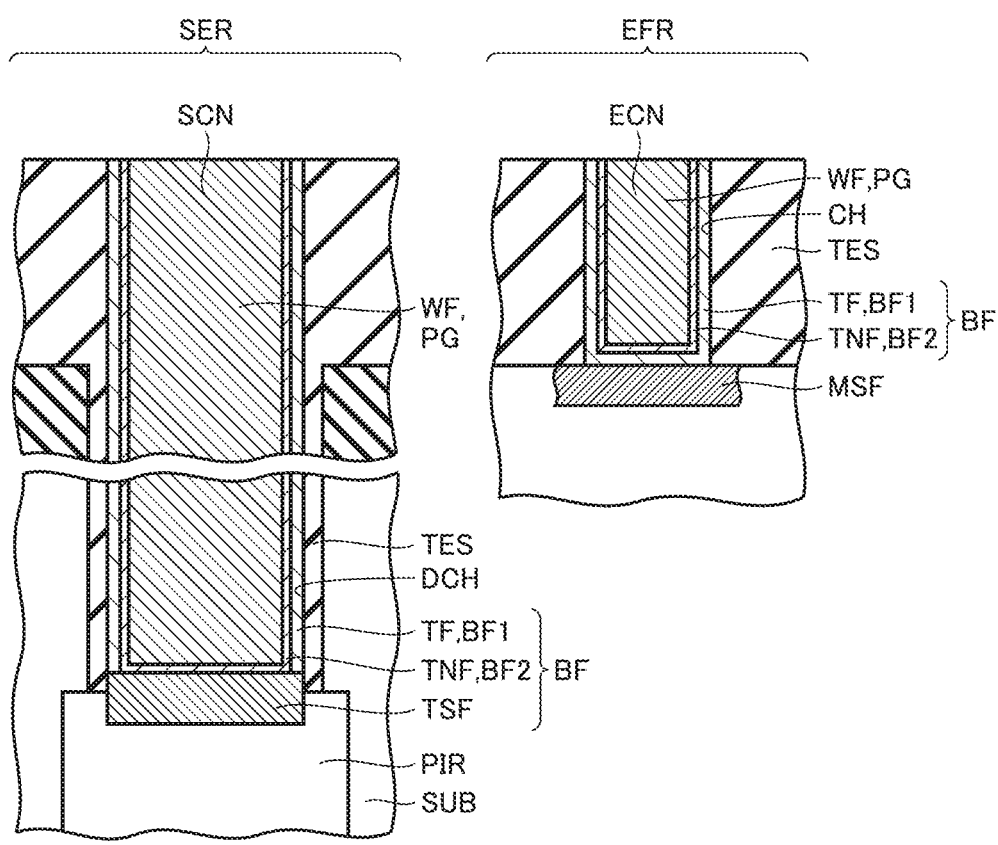
FIG. 19 is a fragmentary enlarged cross-sectional view showing a step performed after the step shown in FIG. 18 in the same embodiment.
Figure 20:
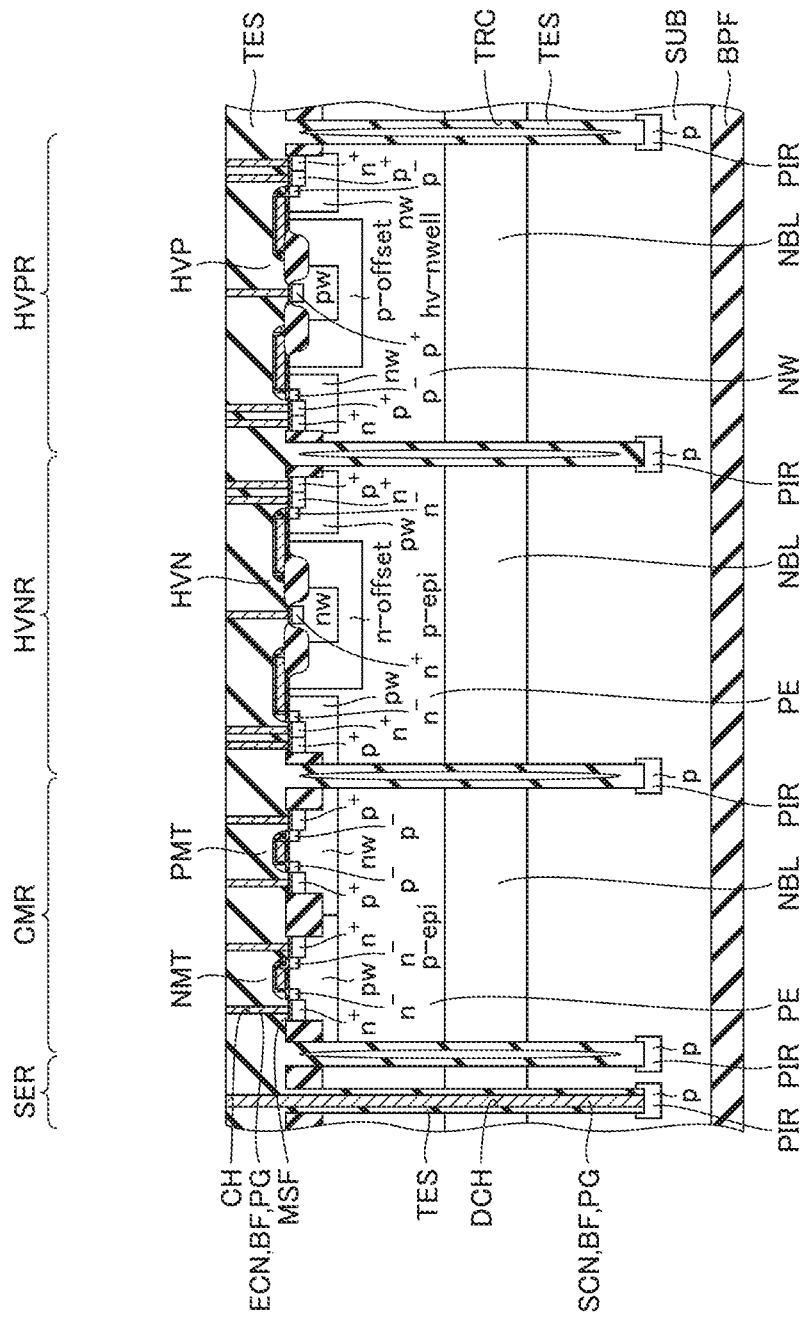
FIG. 20 is a cross-sectional view in the step shown in FIG. 19 in the same embodiment.

Then, a chemical mechanical polishing process is performed to remove portions of titanium film TF, titanium nitride film TNF and tungsten film WF located on the upper surface of TEOS oxide film TES. Consequently, as shown in FIG. 19 or 20, in shallow contact hole CH, element contact portion ECN is formed of the remaining portions of titanium film TF, titanium nitride film TNF and tungsten film WF. In deep contact hole DCH, substrate contact portion SCN is formed of the remaining portions of titanium film TF, titanium silicide film TSF, titanium nitride film TNF and tungsten film WF. It is noted that only one of element contact portions ECN that is closest to substrate contact portion SCN is designated by the reference character in FIG. 20 for the sake of brevity.

Figure 21:
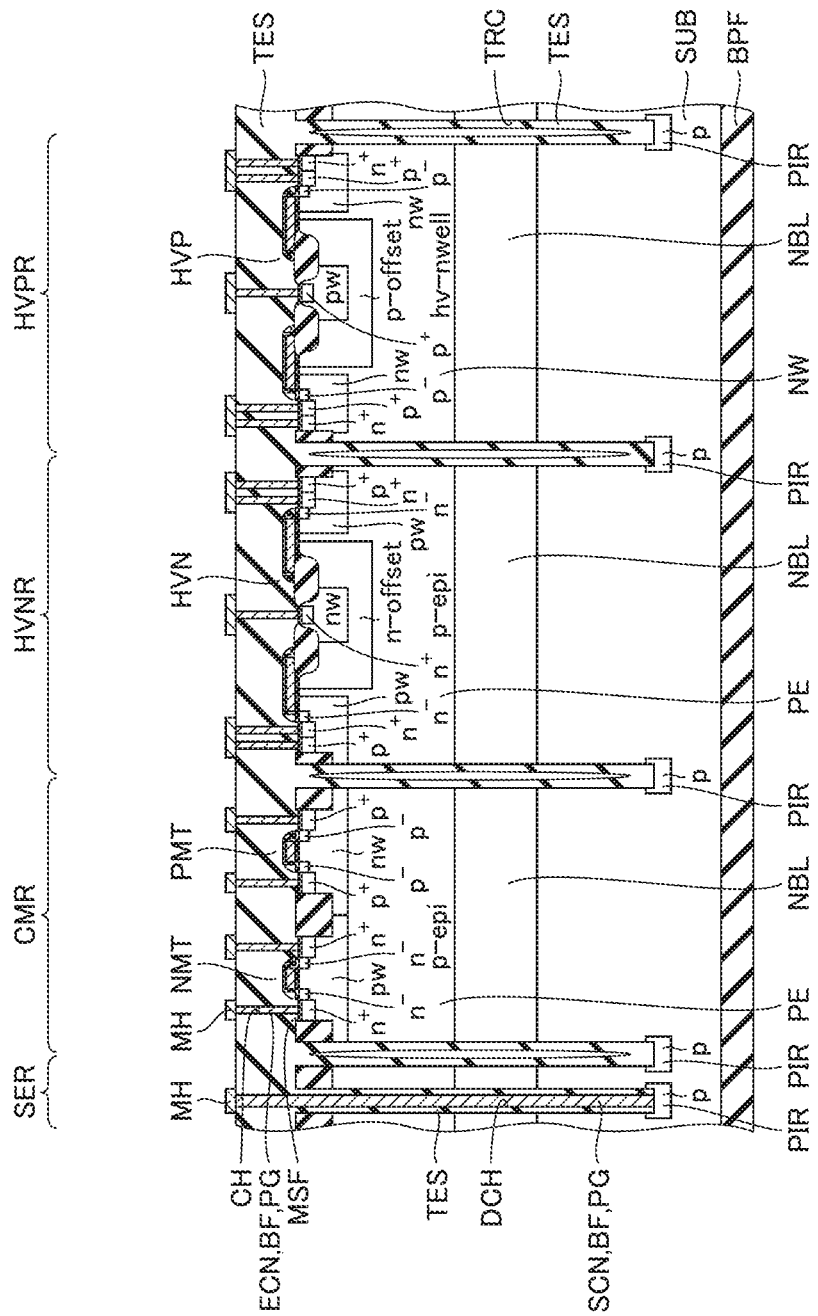
FIG. 21 is a cross-sectional view showing a step performed after the step shown in FIG. 20 in the same embodiment.
Figure 22:
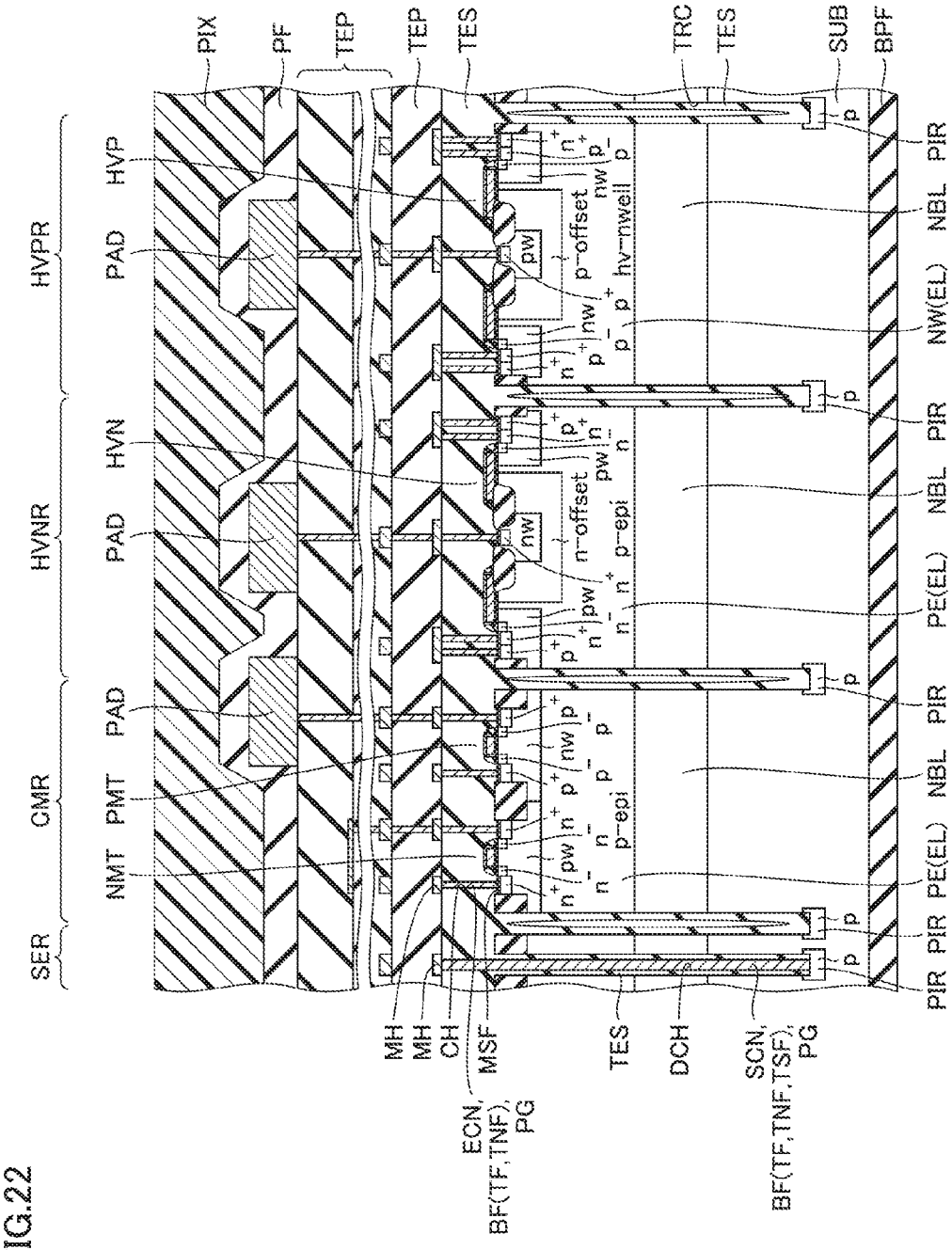
FIG. 22 is a cross-sectional view showing a step performed after the step shown in FIG. 21 in the same embodiment.

Then, as shown in FIG. 21, the plurality of first wires MH are formed by a common technique. A predetermined one of the plurality of first wires MH is electrically connected to substrate contact portion SCN, and another predetermined one of the plurality of first wires MH is electrically connected to element contact portion ECN. Then, as shown in FIG. 22, interlayer insulating film TEP is formed to cover first wires MH. Subsequently, a plurality of wires (partially not shown) and interlayer insulating film TEP are formed as needed. Furthermore, pads PAD are formed, and passivation film PF is formed to cover pads PAD. Polyimide film PIX is formed to cover passivation film PF. In this manner, the substantial part of the semiconductor device is completed.

In the method of manufacturing the semiconductor device described above, substrate contact portion SCN and element contact portion ECN are formed by simultaneously forming barrier metal film BF in deep contact hole DCH exposing semiconductor substrate SUB (silicon) and shallow contact hole CH exposing metal silicide film MSF. This manufacturing method has newly been discovered by the inventor.

Evaluation results that led the inventor to discover this new manufacturing method are now described.

Figure 23:
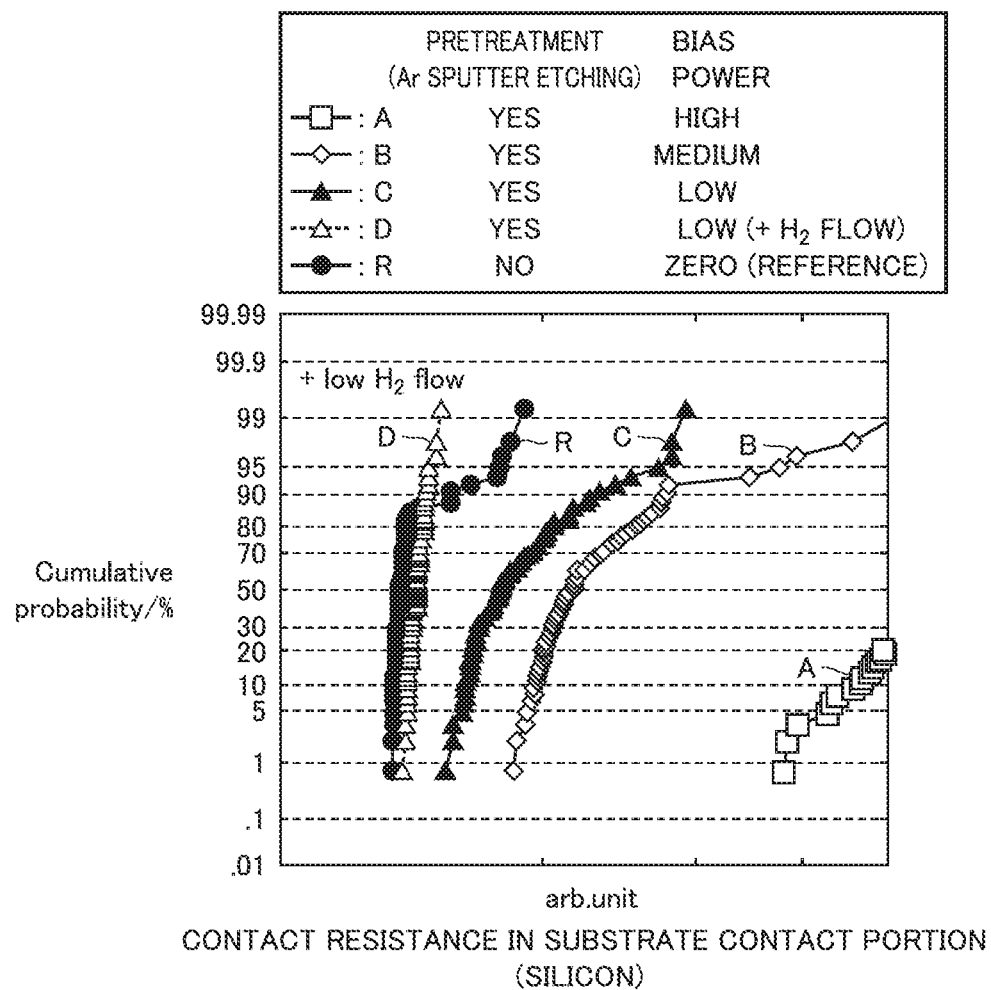
FIG. 23 is a graph showing evaluation results of relation between contact resistance in a substrate contact portion and cumulative probability in the same embodiment.
Figure 24:
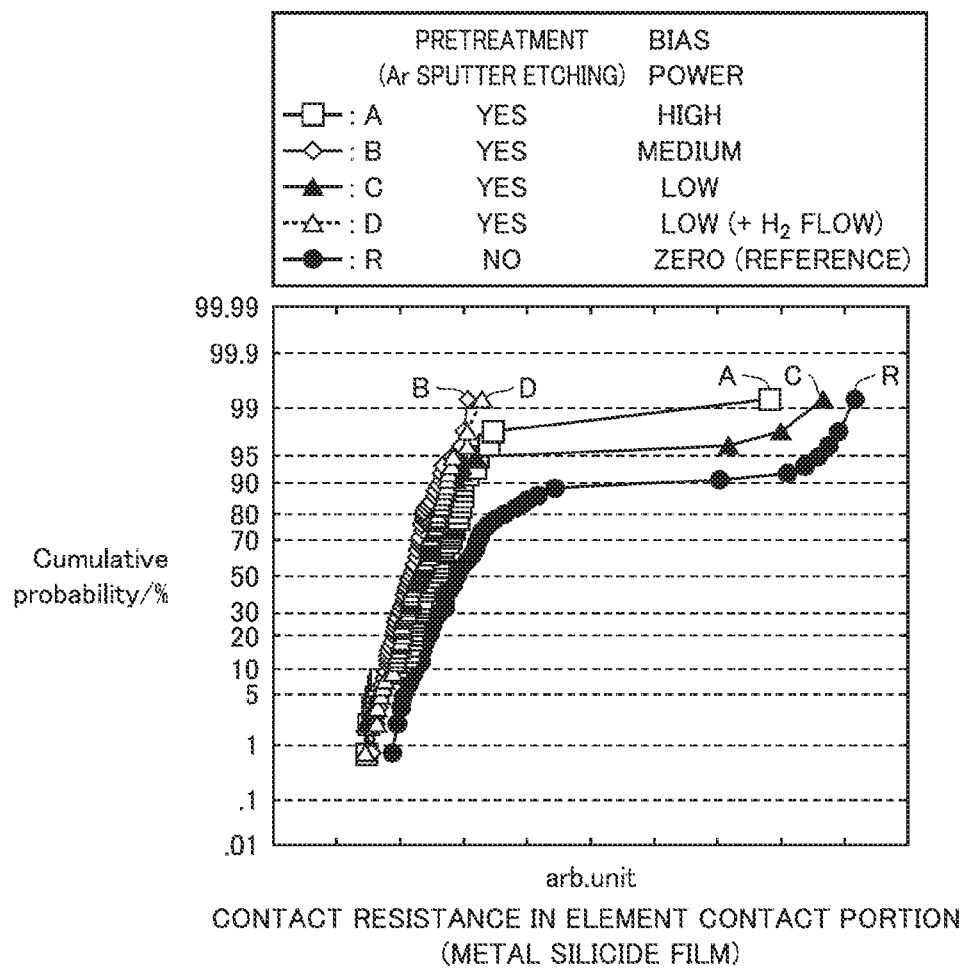
FIG. 24 is a graph showing evaluation results of relation between contact resistance in an element contact portion and cumulative probability in the same embodiment.

FIG. 23 is a graph showing evaluation results of relation between contact resistance in a substrate contact portion and cumulative probability, representing distribution of contact resistance between silicon and the substrate contact portion. FIG. 24 is a graph showing evaluation results of relation between contact resistance in an element contact portion and cumulative probability, representing distribution of contact resistance between metal silicide and the element contact portion.

Five conditions were set as conditions for forming a barrier metal film (pretreatment and bias power). A condition R (reference) was that the pretreatment (Ar sputter etching) was not carried out and the bias power applied to a semiconductor substrate was zero (0 W). A condition A, a condition B and a condition C were that the pretreatment was carried out and the bias power was set to high, medium and low, respectively. A condition D was that the pretreatment was carried out, the bias power was set to low, and furthermore, a small amount of hydrogen (H$_2$) was supplied.

Conventionally, when forming a barrier metal film in a contact hole exposing a metal silicide film, pretreatment is carried out as with condition A, for example. When forming a barrier metal film in a contact hole exposing silicon, in contrast, pretreatment is not carried out as with condition R. However, as shown in FIG. 23, it was found that, when a barrier metal film was formed under condition A in a contact hole exposing silicon, the value of contact resistance in the substrate contact portion increased significantly.

In contrast, as shown in FIG. 24, it was found that, when a barrier metal film was formed under condition R in a contact hole exposing a metal silicide film, variation in the value of contact resistance in the element contact portion increased. For this reason, it has been impossible to simultaneously form a barrier metal film in a contact hole exposing a metal silicide film and a contact hole exposing silicon in a conventional method.

Thus, the inventor performed evaluations in order to discover a method of simultaneously forming a barrier metal film. First, the inventor performed evaluations of a contact hole exposing silicon by gradually reducing the bias power on the premise that the pretreatment was carried out (condition B and condition C). As a result, it was found, as shown in FIG. 23, that the value of contact resistance showed a tendency to decrease gradually, and the range of the variation in contact resistance also decreased gradually.

However, it was found that, even under condition C, the value of contact resistance was still higher than the value of contact resistance under condition R (reference). The inventor further performed various evaluations through trial and error, and discovered a method of forming a barrier metal film with the addition of a small amount of hydrogen (H$_2$) (condition D). It was found that, under condition D, the value of contact resistance approached substantially the same value as the resistance value under condition R (reference), and furthermore, the variation in the value of contact resistance could be made smaller than the variation under condition R.

Next, the inventor formed a barrier metal film in a contact hole exposing a metal silicide film under condition D, performed an evaluation, and found, as shown in FIG. 24, that the value of contact resistance could be reduced and the range of the variation in resistance value could also be reduced as in the case of condition B. In this manner, the inventor discovered a method forming substrate contact portion SCN and element contact portion ECN by forming barrier metal film BF simultaneously under the same conditions in contact hole CH at which the metal silicide is exposed and contact hole DCH at which the silicon (semiconductor substrate SUB) is exposed.

The structures of substrate contact portion SCN and element contact portion ECN thus formed are now described.

Figure 25:
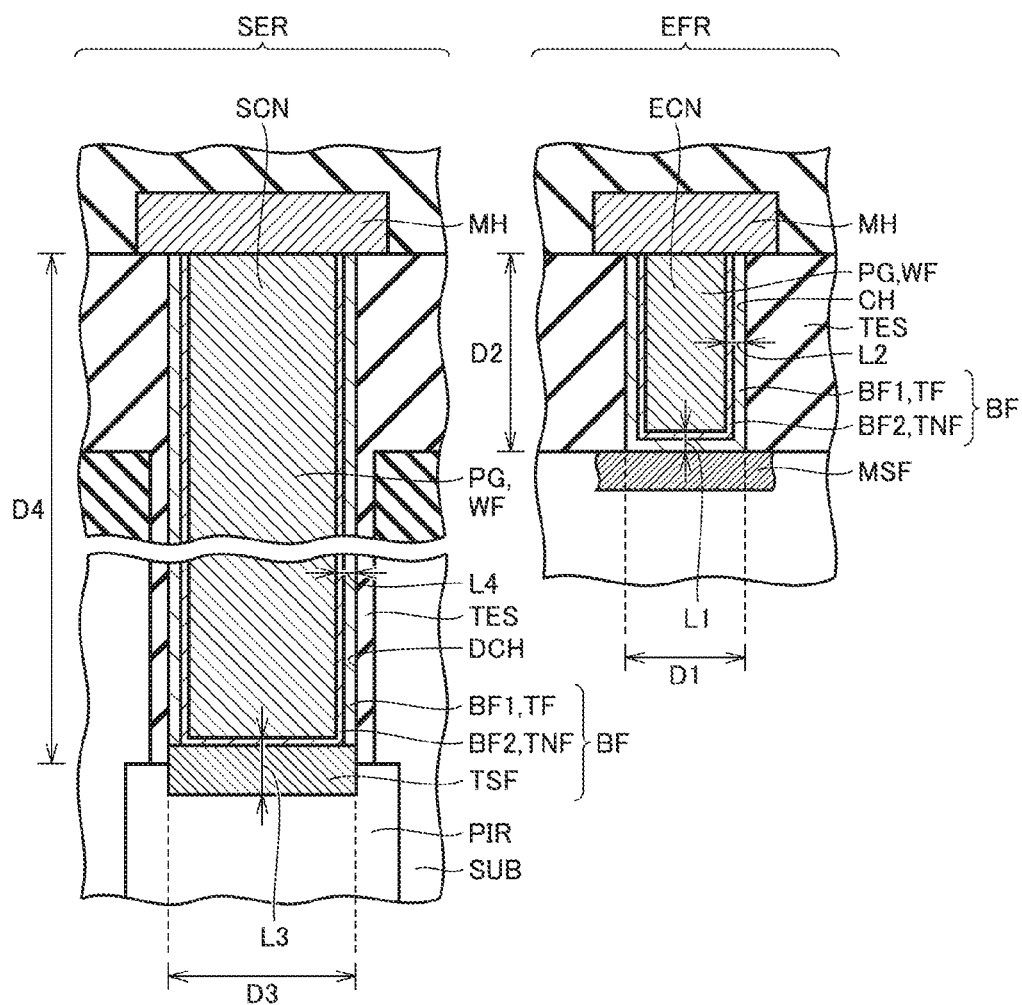
FIG. 25 is a fragmentary enlarged cross-sectional view showing the substrate contact portion and the element contact portion in order to illustrate the features of a barrier metal film in the same embodiment.

As shown in FIG. 25, in element contact portion ECN (D1: about 0.08 μm, D2: about 0.5 μm, aspect ratio (D2/D1): about 6.25), a film thickness L1 of barrier metal film BF located at the bottom surface is about 25 nm (titanium film TF (15 nm)+titanium nitride film TNF (10 nm)). A film thickness L2 of barrier metal film BF located at the side surface is about 25 nm (titanium film TF (15 nm)+titanium nitride film TNF (10 nm)). Thus, a ratio A of film thickness L1 to film thickness L2 (film thickness L1/film thickness L2) is 1.

In contrast, in substrate contact portion SCN (D3: about 0.5 μm, D4: about 15 μm, aspect ratio (D4/D3): about 30), a film thickness L3 of barrier metal film BF located at the bottom surface is about 70 nm (titanium silicide film TSF (60 nm)+titanium nitride film TNF (10 nm)). A film thickness L4 of barrier metal film BF located at the side surface is about 25 nm (titanium film TF (15 nm)+titanium nitride film TNF (10 nm)). Thus, a ratio B of film thickness L2 to film thickness L4 (film thickness L2/film thickness L4) is 2.8. Accordingly, it was found that a relation of ratio A (1)<ratio B (2.8) held in this case. It is noted that the values of the film thicknesses of the barrier metal film and the like listed here are merely exemplary and the thicknesses are not limited to these values.

Second Embodiment

In this embodiment, an example of a semiconductor device is described in which a cobalt film or the like is formed as the barrier metal film of the substrate contact portion and the element contact portion. This semiconductor device is manufactured with a similar method to the above-described manufacturing method, except for the step of forming the barrier metal film.

Figure 26:
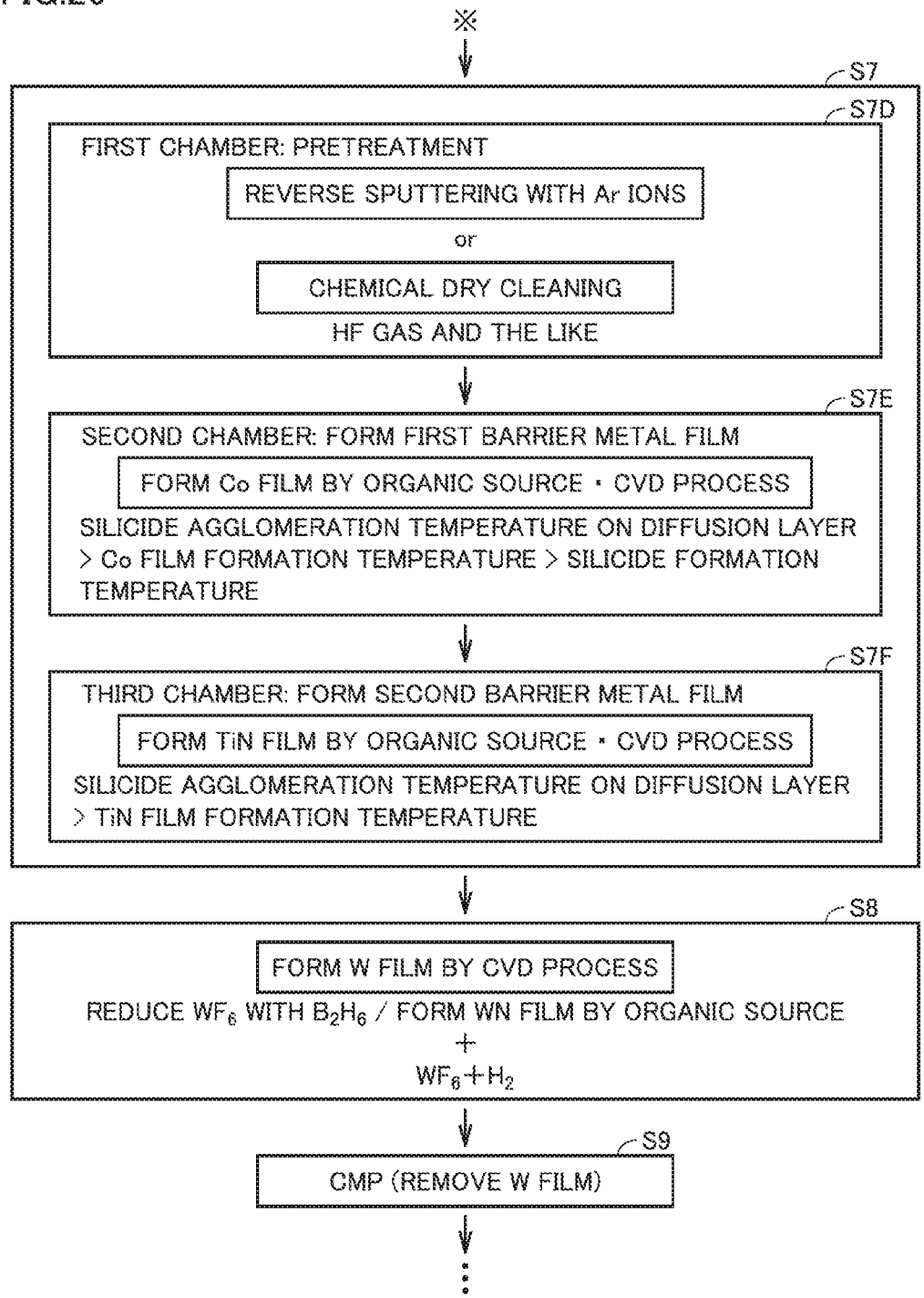
FIG. 26 is a flowchart showing steps of forming the substrate contact portion and the element contact portion in a method of manufacturing a semiconductor device according to a second embodiment.
Figure 27:
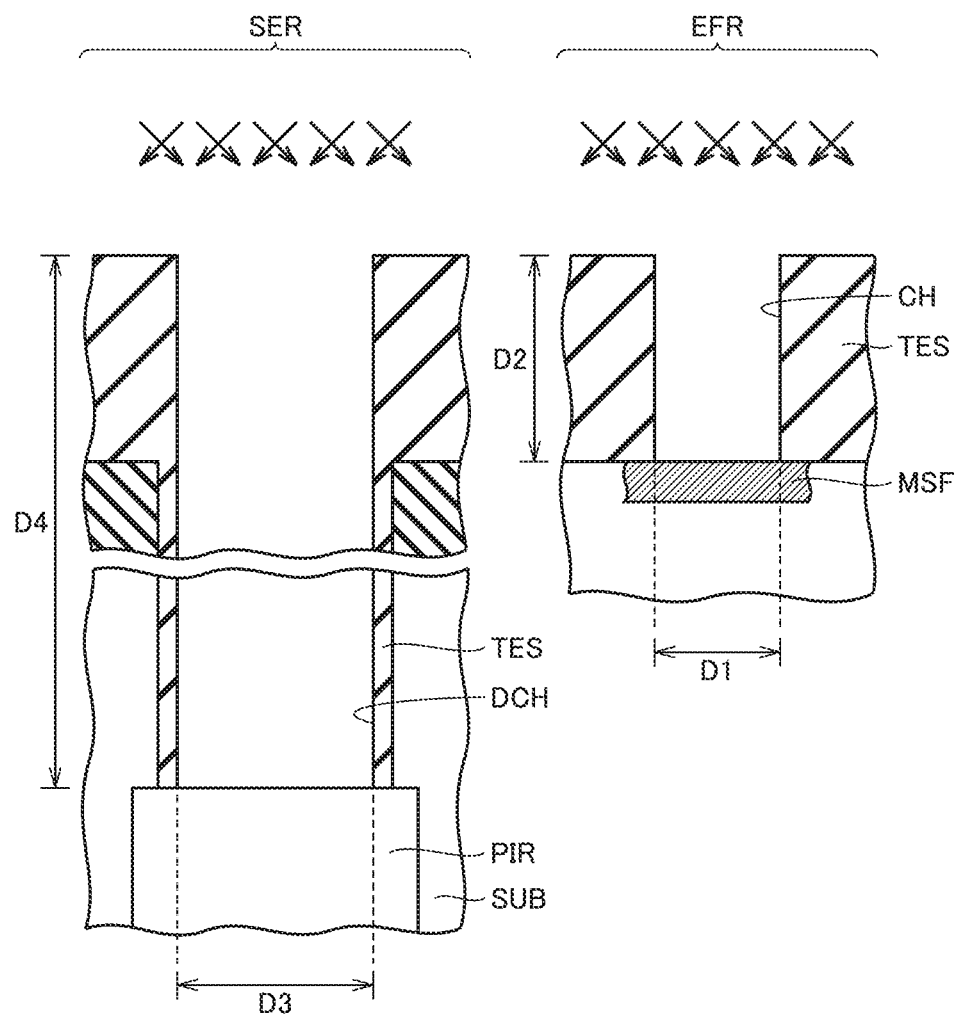
FIG. 27 is a fragmentary enlarged cross-sectional view showing a step of the method of manufacturing the semiconductor device in the same embodiment.

First, its manufacturing flow is described. A shallow contact hole and a deep contact hole are formed through similar steps to the steps shown in FIGS. 7 to 12. Then, as shown in FIG. 26, in step S7, a barrier metal film is simultaneously formed in the shallow contact hole and the deep contact hole. First, a wafer (semiconductor substrate) is transferred into a first chamber (not shown). Pretreatment is carried out in the first chamber (see step S7D in FIG. 26). As shown in FIG. 27, reverse sputtering with Ar ions or chemical dry cleaning with HF gas and the like is performed.

At this time, when reverse sputtering with Ar ions is to be performed, conditions are set such that knock-on does not occur in semiconductor substrate SUB by sputter etching with Ar ions. When chemical dry etching is to be performed, conditions are set such that semiconductor substrate SUB is not etched by chemical dry cleaning.

Then, the wafer (semiconductor substrate) that has been subjected to the pretreatment is transferred from the first chamber to a second chamber (not shown). In the second chamber, a cobalt (Co) film is formed as the first barrier metal film (see step S7E in FIG. 26).

Bis(cyclopentadienyl)cobalt(II) (Co($\eta^5$C$_5$H$_5$)$_2$), for example, is supplied as an organic source of cobalt into the second chamber. The cobalt film is formed by a CVD process under prescribed temperature conditions. The temperature conditions are set such that the temperature is higher than temperature at which cobalt silicide is formed and lower than temperature at which metal silicide film MSF (cobalt silicide) agglomerates.

Figure 28:
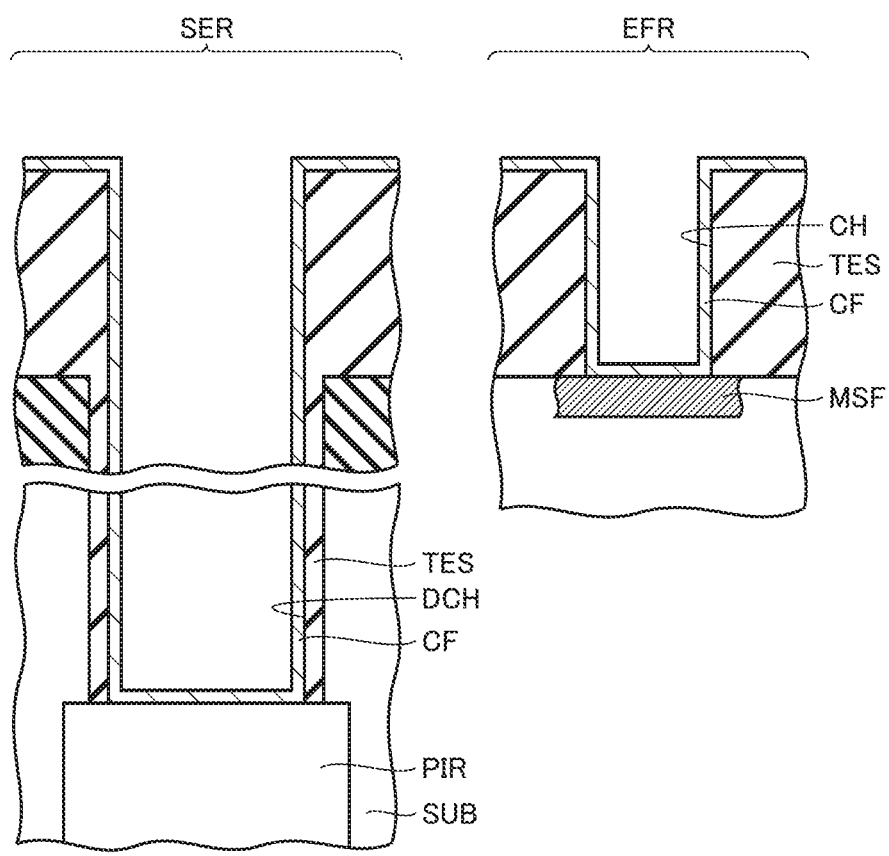
FIG. 28 is a fragmentary enlarged cross-sectional view showing a step performed after the step shown in FIG. 27 in the same embodiment.

Consequently, as shown in FIG. 28, a cobalt film CF having a film thickness of about 15 nm, for example, is formed on the side surfaces of shallow contact hole CH and the surface of metal silicide film MSF. Cobalt film CF having a film thickness of about 15 nm is formed on the side surfaces of deep contact hole DCH. Here, the cobalt film having a film thickness of about 15 nm will remain at the bottom of deep contact hole DCH unless silicidation occurs (see FIG. 28). At the bottom of deep contact hole DCH, however, the cobalt (Co) deposited is in contact with semiconductor substrate SUB (P type impurity region PIR). In addition, the cobalt film has been formed at the temperature higher than temperature at which cobalt silicide is formed.

Figure 29:
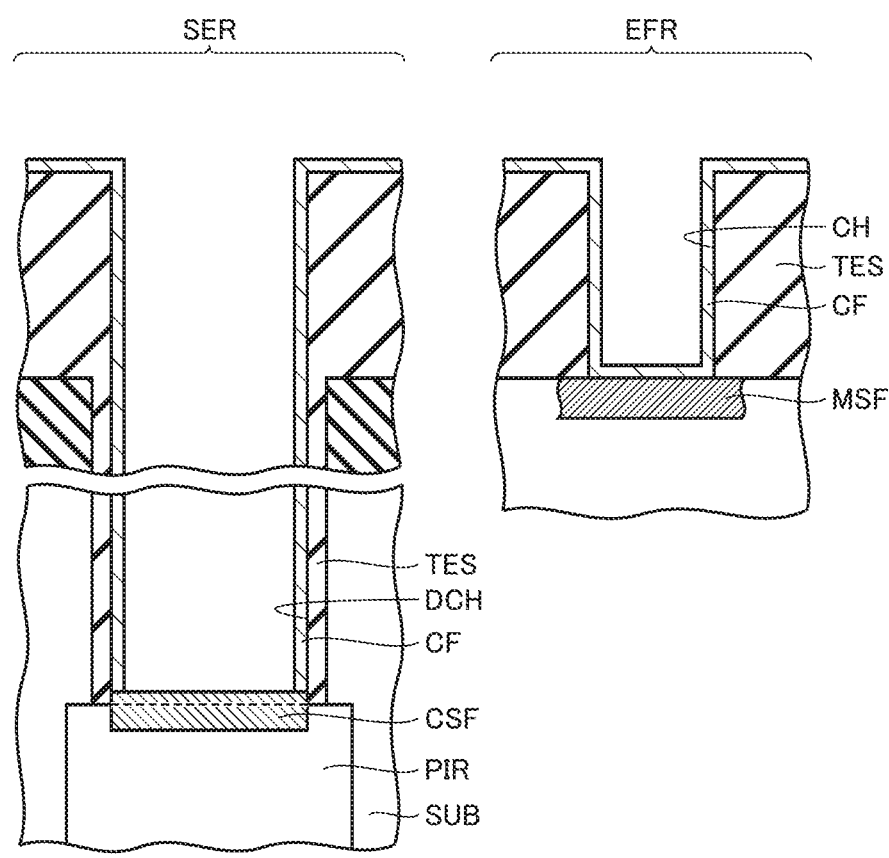
FIG. 29 is a fragmentary enlarged cross-sectional view showing a step performed after the step shown in FIG. 28 in the same embodiment.

Accordingly, as shown in FIG. 29, the cobalt (Co) reacts with the silicon (Si) in semiconductor substrate SUB to form a cobalt silicide (CoSi$_2$) film. Stoichiometrically, cobalt film CF having a film thickness of about 15 nm becomes a cobalt silicide film CSF having a film thickness of about 45 nm (15 nm×3) by the silicidation. In this manner, in deep contact hole DCH, cobalt film CF is formed as the first barrier metal film and cobalt silicide film CSF is formed as the third barrier metal film.

Then, the wafer (semiconductor substrate) now having cobalt film CF and the like is transferred from the second chamber to a third chamber (not shown). In the third chamber, a titanium nitride (TiN) film is formed as the second barrier metal film (see step S7F in FIG. 26). In this case, the titanium nitride film is formed by a CVD process under prescribed temperature conditions, with a supply of tetrakis(dimethylamino)titanium(IV) (Ti(N(CH$_3$)$_2$)$_4$), for example, as an organic source of titanium into the third chamber. The temperature conditions are set such that the temperature is higher than temperature at which a titanium nitride film is formed and lower than temperature at which metal silicide film MSF (cobalt silicide film) agglomerates.

Figure 30:
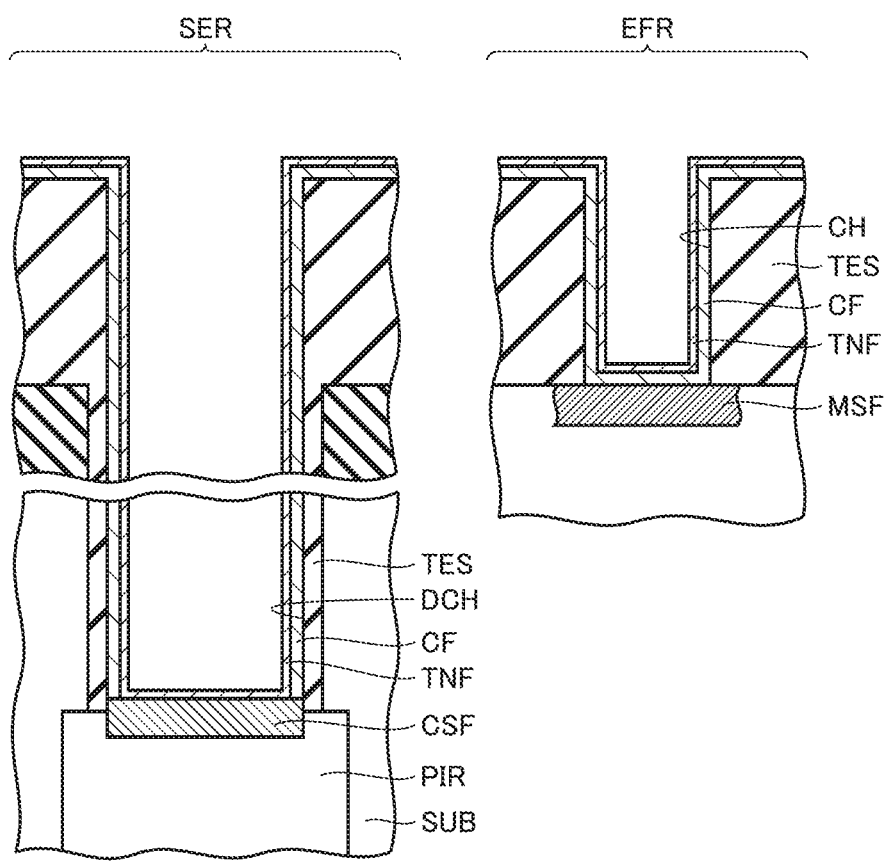
FIG. 30 is a fragmentary enlarged cross-sectional view showing a step performed after the step shown in FIG. 29 in the same embodiment.

Consequently, as shown in FIG. 30, in shallow contact hole CH, titanium nitride (TiN) film TNF having a film thickness of about 10 nm, for example, is formed so as to be in contact with cobalt film CF. In deep contact hole DCH, titanium nitride (TiN) film TNF having a film thickness of about 10 nm is formed so as to be in contact with cobalt film CF and cobalt silicide film CSF.

Figure 31:
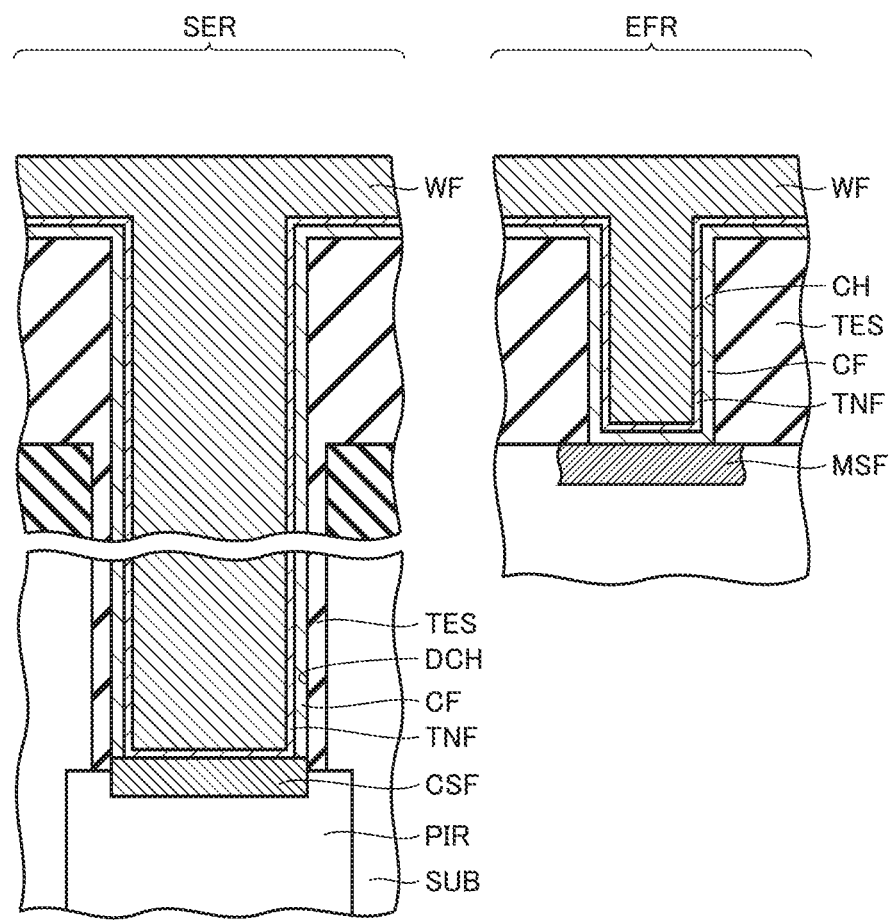
FIG. 31 is a fragmentary enlarged cross-sectional view showing a step performed after the step shown in FIG. 30 in the same embodiment.

Then, the wafer (semiconductor substrate) now having titanium nitride film TNF is transferred from the third chamber to a tungsten film deposition apparatus (not shown) where, as shown in FIG. 31, tungsten film WF is formed to fill shallow contact hole CH and tungsten film WF is formed to fill deep contact hole DCH (see step S8 in FIG. 26).

Figure 32:
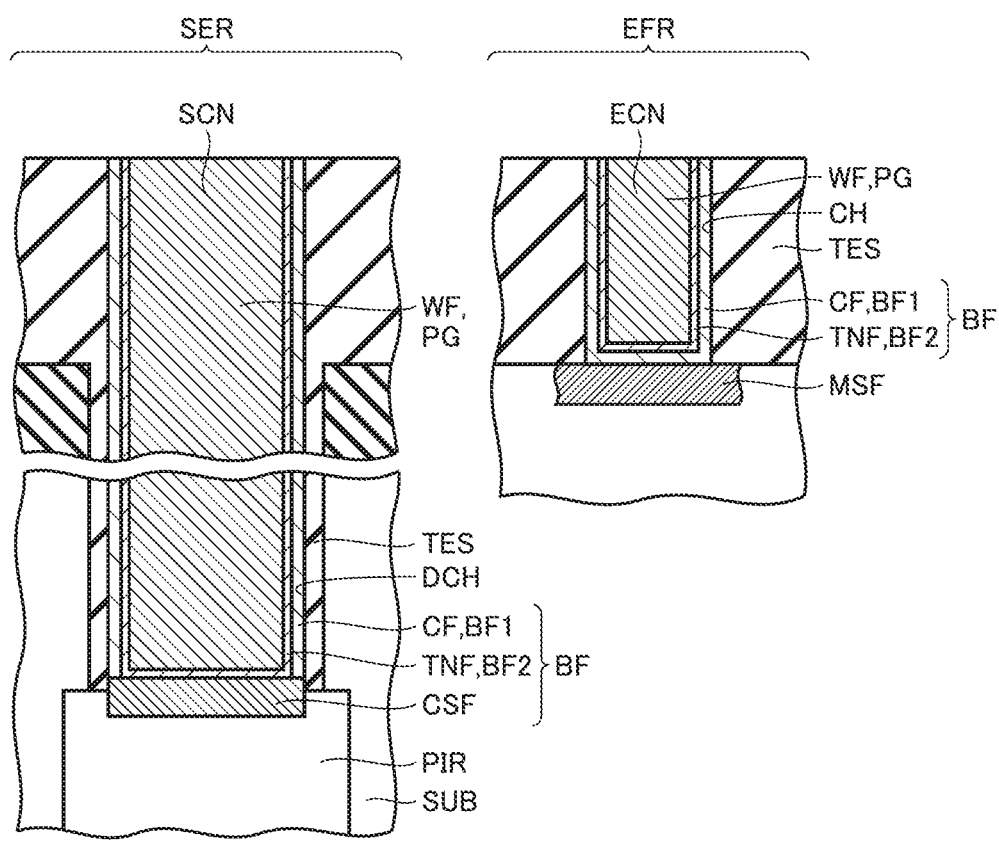
FIG. 32 is a fragmentary enlarged cross-sectional view showing a step performed after the step shown in FIG. 31 in the same embodiment.
Figure 33:
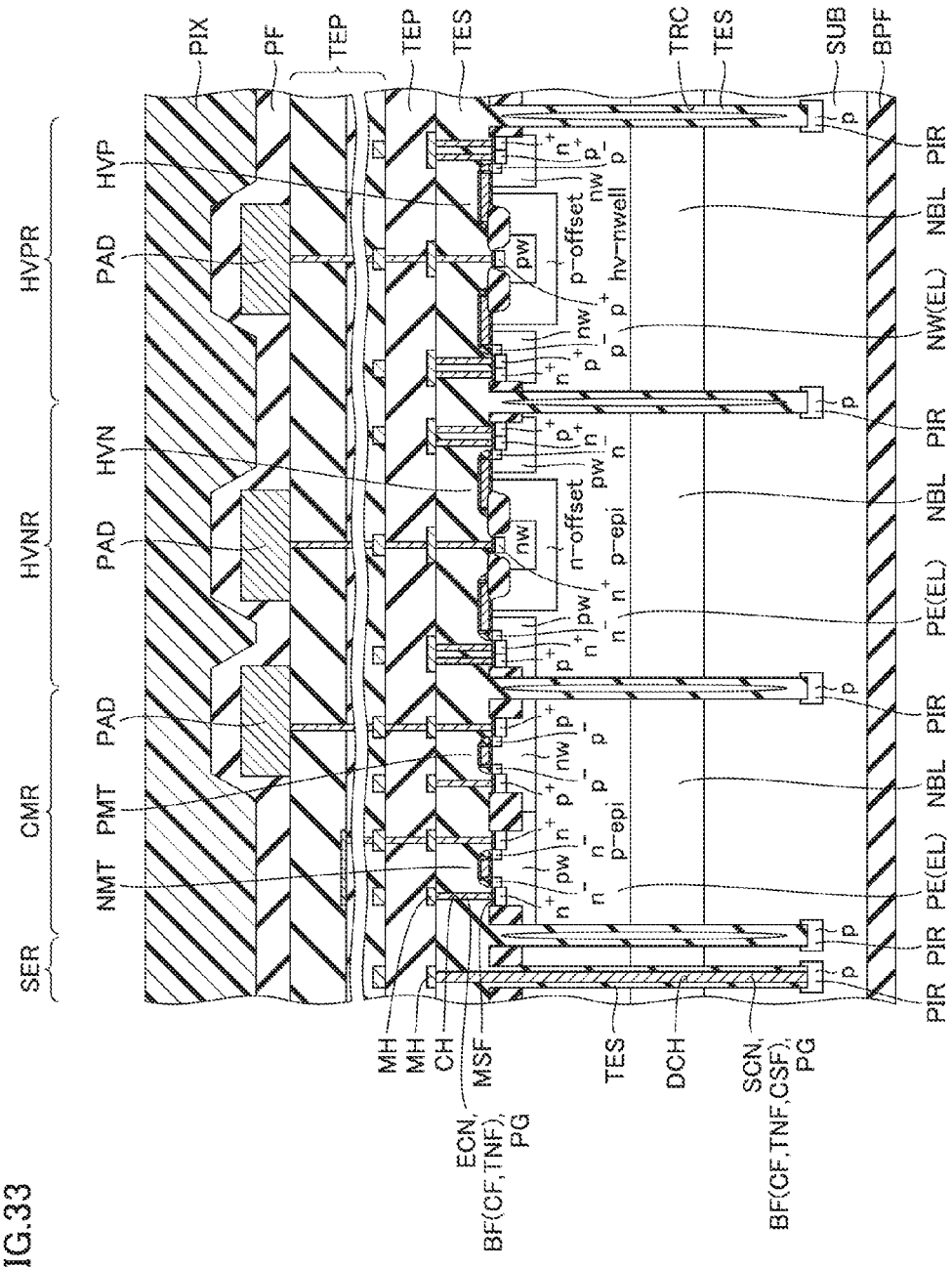
FIG. 33 is a cross-sectional view showing a step performed after the step shown in FIG. 32 in the same embodiment.

Then, a chemical mechanical polishing process is performed. Consequently, as shown in FIG. 32, in shallow contact hole CH, element contact portion ECN is formed of the remaining portions of cobalt film CF, titanium nitride film TNF and tungsten film WF. In deep contact hole DCH, substrate contact portion SCN is formed of the remaining portions of cobalt film CF, cobalt silicide film CSF, titanium nitride film TNF and tungsten film WF (see step S9 in FIG. 26). Subsequently, similar steps to the steps shown in FIGS. 22 and 23 are performed, to thereby complete the substantial part of the semiconductor device as shown in FIG. 33.

The inventor made various evaluations of a cobalt film as with a titanium film, and discovered a method forming substrate contact portion SCN and element contact portion ECN by forming barrier metal film BF including cobalt film CF simultaneously under the same conditions, as shown in FIG. 26, in contact hole CH at which the metal silicide is exposed and contact hole DCH at which the silicon (semiconductor substrate SUB) is exposed.

The structures of substrate contact portion SCN and element contact portion ECN thus formed are now described.

Figure 34:
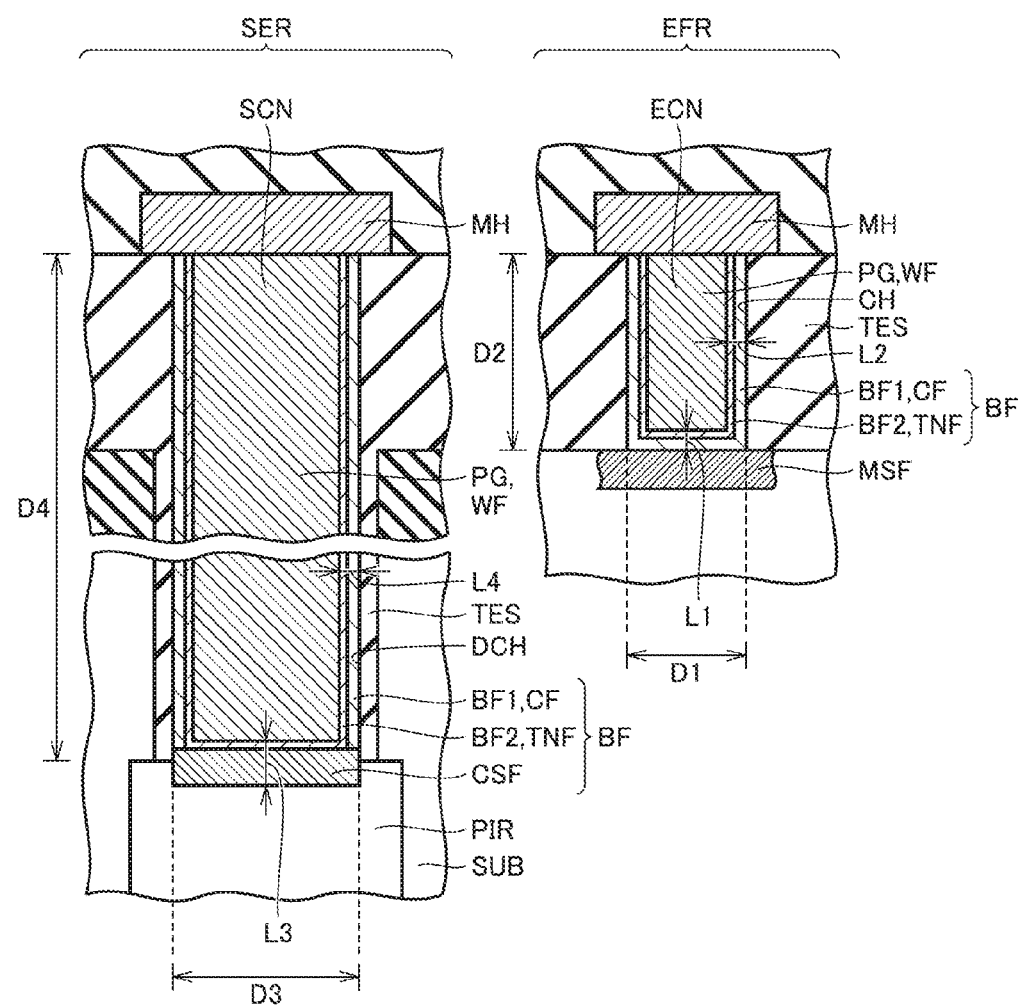
FIG. 34 is a fragmentary enlarged cross-sectional view showing the substrate contact portion and the element contact portion in order to illustrate the features of the barrier metal film in the same embodiment.

As shown in FIG. 34, in element contact portion ECN (D1: about 0.08 μm, D2: about 0.5 μm, aspect ratio (D2/D1): about 6.25), a film thickness L1 of barrier metal film BF located at the bottom surface is about 25 nm (cobalt film CF (15 nm)+titanium nitride film TNF (10 nm)). A film thickness L2 of barrier metal film BF located at the side surface is about 25 nm (cobalt film CF (15 nm)+titanium nitride film TNF (10 nm)). Thus, a ratio A of film thickness L1 to film thickness L2 (film thickness L1/film thickness L2) is 1.

In contrast, in substrate contact portion SCN (D3: about 0.5 μm, D4: about 15 μm, aspect ratio (D4/D3): about 30), a film thickness L3 of barrier metal film BF located at the bottom surface is about 55 nm (cobalt silicide film CSF (45 nm)+titanium nitride film TNF (10 nm)). A film thickness L4 of barrier metal film BF located at the side surface is about 25 nm (cobalt film CF (15 nm)+titanium nitride film TNF (10 nm)). Thus, a ratio B of film thickness L2 to film thickness L4 (film thickness L2/film thickness L4) is 2.2 Accordingly, it was found that a relation of ratio A (1)<ratio B (2.2) held in this case. It is noted that the values of the film thicknesses of the barrier metal film and the like listed here are merely exemplary and the thicknesses are not limited to these values.

Third Embodiment

In this embodiment, an example of a semiconductor device is described in which a nickel film or the like is formed as the barrier metal film of the substrate contact portion and the element contact portion. This semiconductor device is manufactured with a similar method to the manufacturing method described in the first embodiment, except for the step of forming the barrier metal film.

Figure 35:
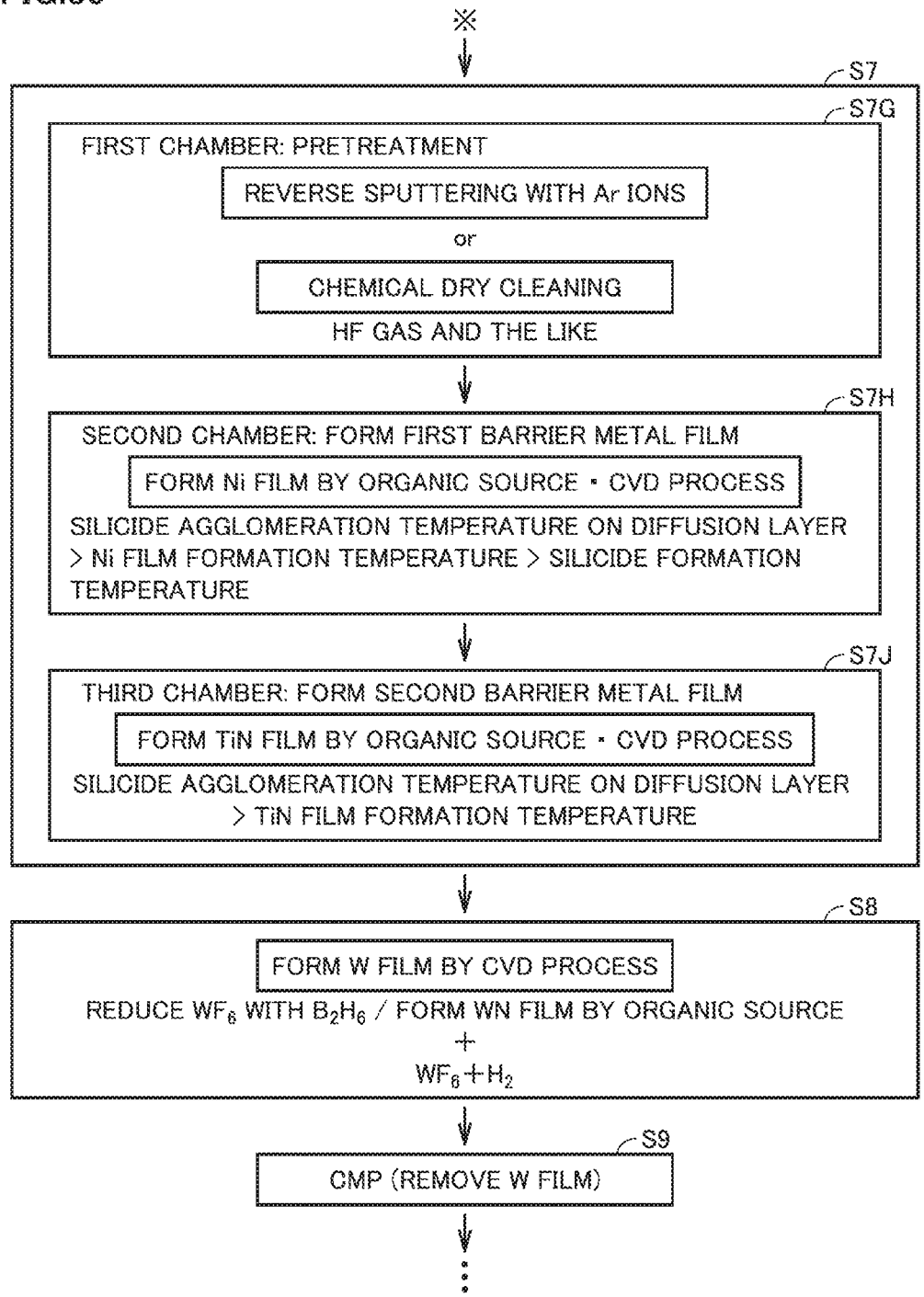
FIG. 35 is a flowchart showing steps of forming the substrate contact portion and the element contact portion in a method of manufacturing a semiconductor device according to a third embodiment.
Figure 36:
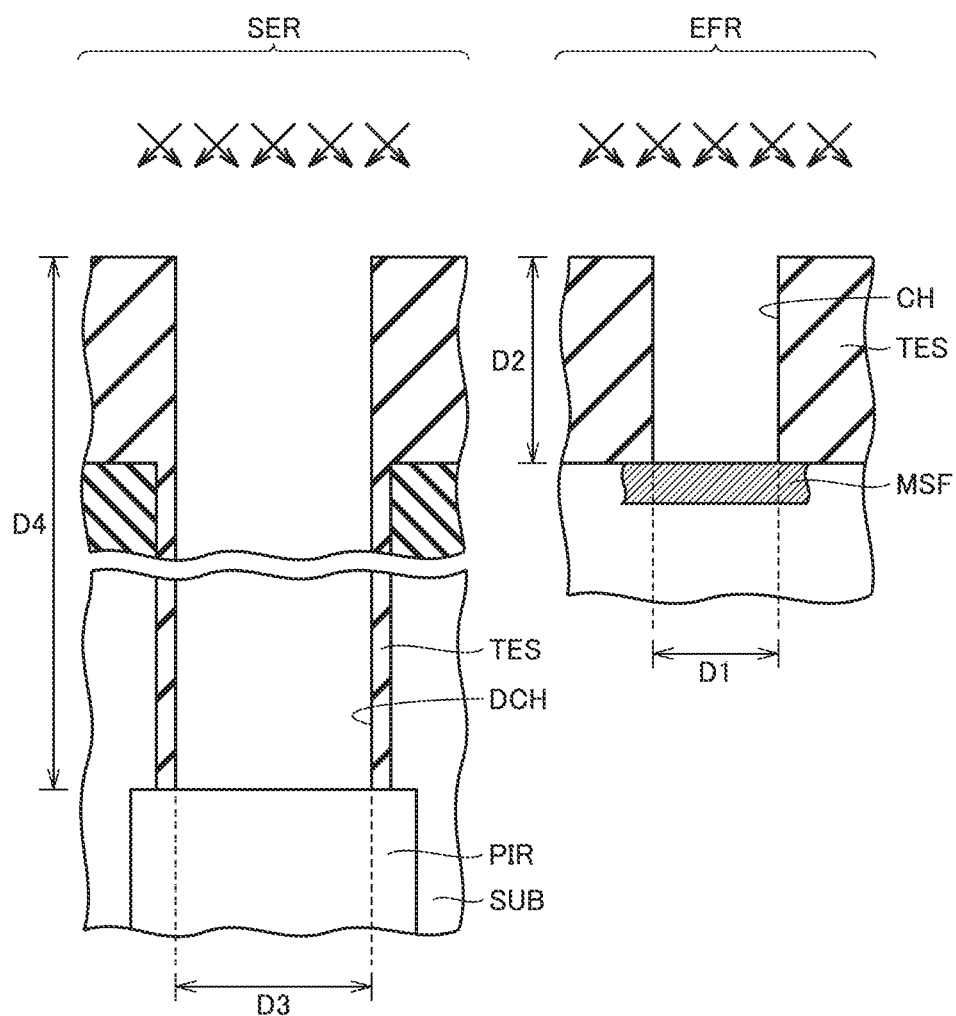
FIG. 36 is a fragmentary enlarged cross-sectional view showing a step of the method of manufacturing the semiconductor device in the same embodiment.

First, its manufacturing flow is described. A shallow contact hole and a deep contact hole are formed through similar steps to the steps shown in FIGS. 7 to 12. Then, as shown in FIG. 35, in step S7, a barrier metal film is simultaneously formed in the shallow contact hole and the deep contact hole. First, a wafer (semiconductor substrate) is transferred into a first chamber (not shown). Pretreatment is carried out in the first chamber (see step S7G in FIG. 35). As shown in FIG. 36, reverse sputtering with Ar ions or chemical dry cleaning with HF gas and the like is performed.

At this time, when reverse sputtering with Ar ions is to be performed, conditions are set such that knock-on does not occur in semiconductor substrate SUB by sputter etching with Ar ions. When chemical dry etching is to be performed, conditions are set such that semiconductor substrate SUB is not etched by chemical dry cleaning.

Then, the wafer (semiconductor substrate) that has been subjected to the pretreatment is transferred from the first chamber to a second chamber (not shown). In the second chamber, a nickel (Ni) film is formed as the first barrier metal film (see step S7H in FIG. 35).

Ni(II)N,N'-di-tertiarybutylamidinate (Ni(II)(tBu-AMD)$_2$), for example, is supplied as an organic source of nickel into the second chamber. The nickel film is formed by a CVD process under prescribed temperature conditions. The temperature conditions are set such that the temperature is higher than temperature at which nickel silicide is formed and lower than temperature at which metal silicide film MSF (cobalt silicide) agglomerates.

Figure 37:
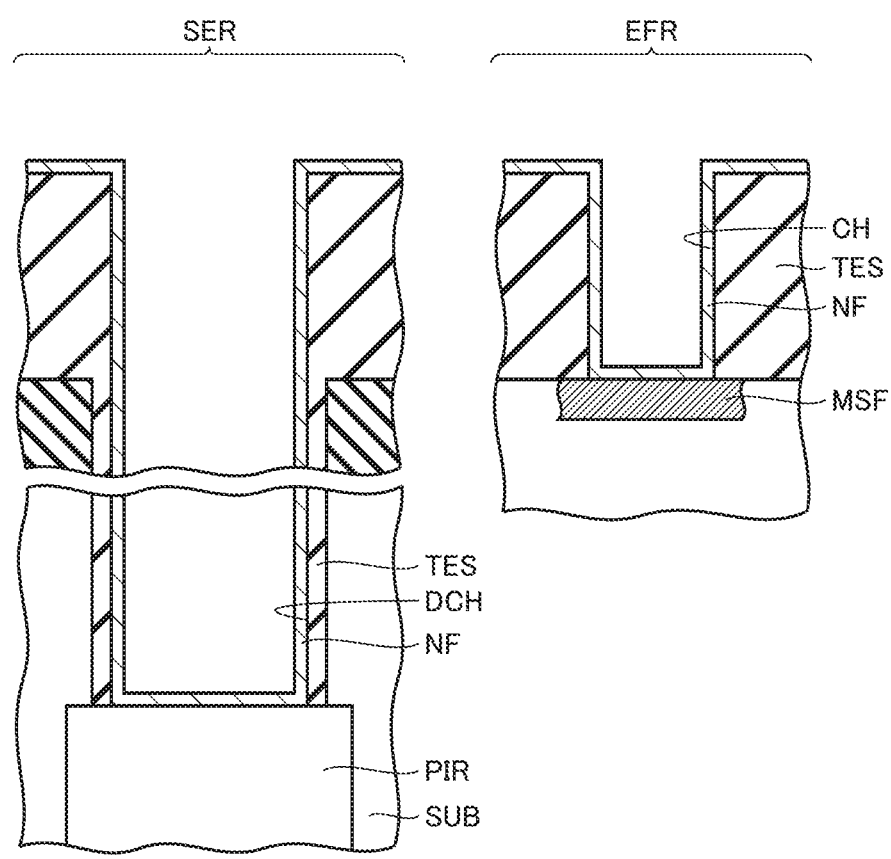
FIG. 37 is a fragmentary enlarged cross-sectional view showing a step performed after the step shown in FIG. 36 in the same embodiment.

Consequently, as shown in FIG. 37, a nickel film NF having a film thickness of about 15 nm, for example, is formed on the side surfaces of shallow contact hole CH and the surface of metal silicide film MSF. Nickel film NF having a film thickness of about 15 nm is formed on the side surfaces of deep contact hole DCH. Here, the nickel film having a film thickness of about 15 nm will remain at the bottom of deep contact hole DCH unless silicidation occurs (see FIG. 37). At the bottom of deep contact hole DCH, however, the nickel (Ni) deposited is in contact with semiconductor substrate SUB (P type impurity region PIR). In addition, the nickel film has been formed at the temperature higher than temperature at which nickel silicide is formed.

Figure 38:
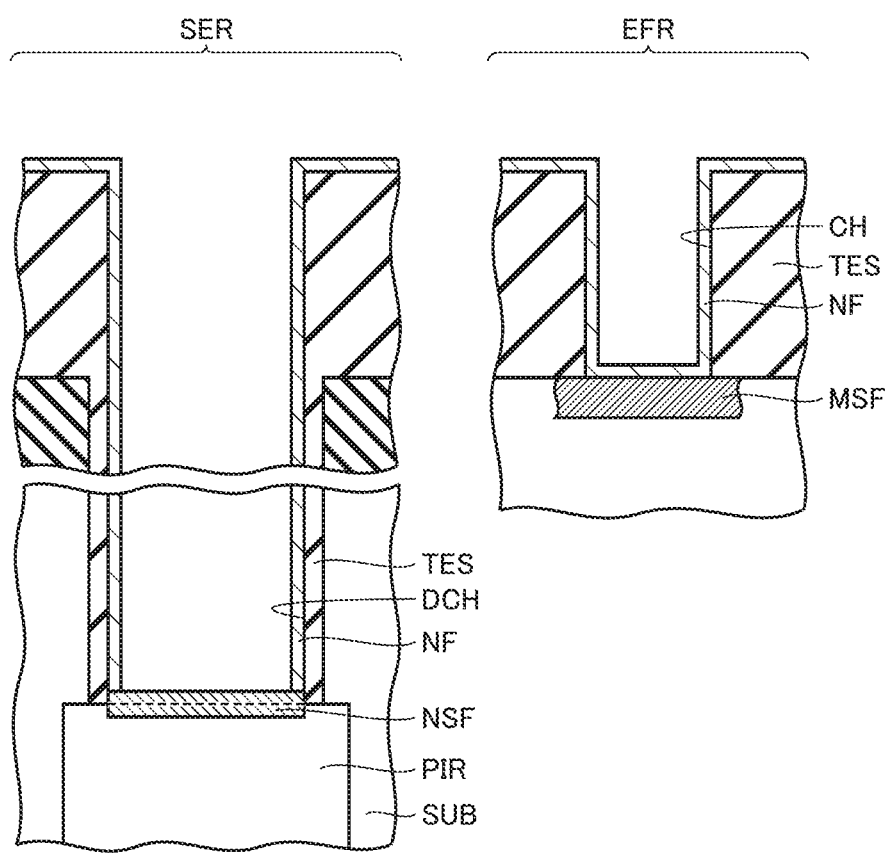
FIG. 38 is a fragmentary enlarged cross-sectional view showing a step performed after the step shown in FIG. 37 in the same embodiment.

Accordingly, as shown in FIG. 38, the nickel (Ni) reacts with the silicon (Si) in semiconductor substrate SUB to form a nickel silicide (NiSi) film. Stoichiometrically, nickel film NF having a film thickness of about 15 nm becomes a nickel silicide film NSF having a film thickness of about 30 nm (15 nm×2) by the silicidation. In this manner, in deep contact hole DCH, nickel film NF is formed as the first barrier metal film and nickel silicide film NSF is formed as the third barrier metal film.

Then, the wafer (semiconductor substrate) now having nickel film NF and the like is transferred from the second chamber to a third chamber (not shown). In the third chamber, a titanium nitride (TiN) film is formed as the second barrier metal film (see step S7J in FIG. 35). In this case, the titanium nitride film is formed by a CVD process under prescribed temperature conditions, with a supply of tetrakis(dimethylamino)titanium(IV) (Ti(N(CH$_3$)$_2$)$_4$), for example, as an organic source of titanium into the third chamber. The temperature conditions are set such that the temperature is higher than temperature at which a titanium nitride film is formed and lower than temperature at which metal silicide film MSF (cobalt silicide film) agglomerates.

Figure 39:
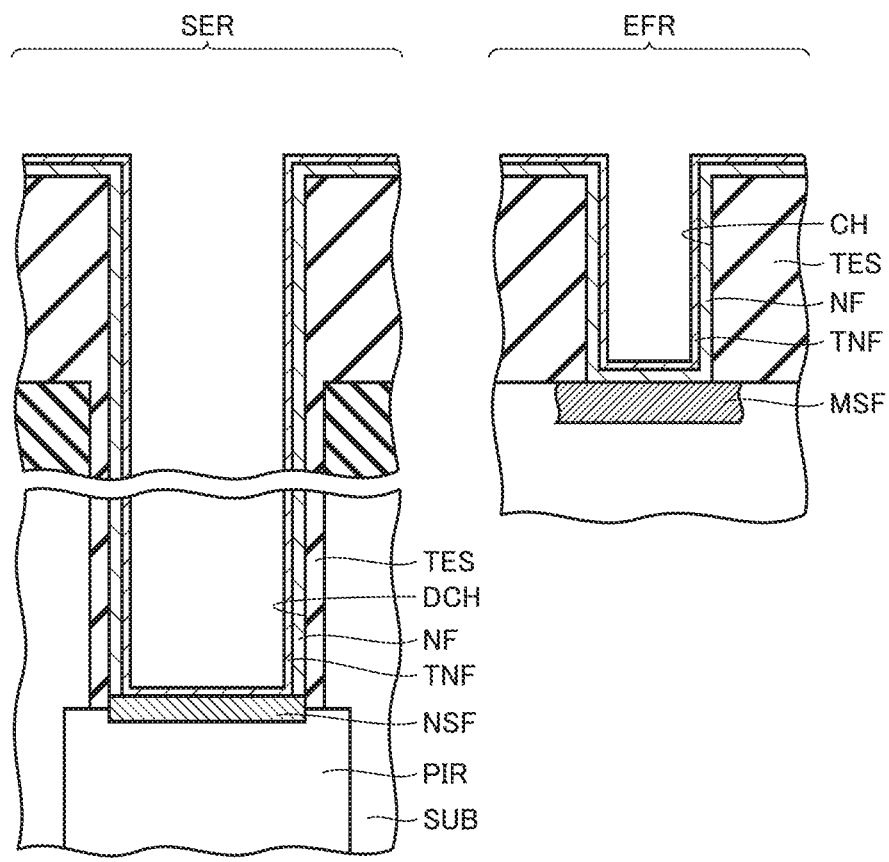
FIG. 39 is a fragmentary enlarged cross-sectional view showing a step performed after the step shown in FIG. 38 in the same embodiment.

Consequently, as shown in FIG. 39, in shallow contact hole CH, titanium nitride (TiN) film TNF having a film thickness of about 10 nm, for example, is formed so as to be in contact with nickel film NF. In deep contact hole DCH, titanium nitride (TiN) film TNF having a film thickness of about 10 nm is formed so as to be in contact with nickel film NF and nickel silicide film NSF.

Figure 40:
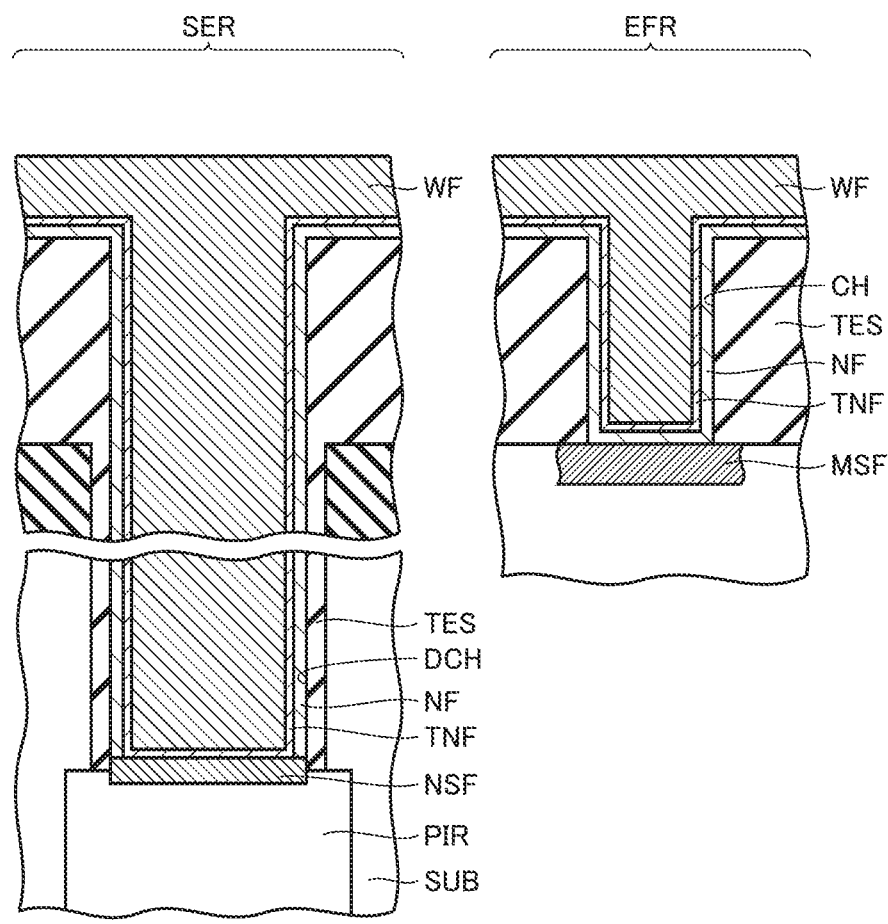
FIG. 40 is a fragmentary enlarged cross-sectional view showing a step performed after the step shown in FIG. 39 in the same embodiment.

Then, the wafer (semiconductor substrate) now having titanium nitride film TNF is transferred from the third chamber to a tungsten film deposition apparatus (not shown) where, as shown in FIG. 40, tungsten film WF is formed to fill shallow contact hole CH and tungsten film WF is formed to fill deep contact hole DCH (see step S8 in FIG. 35).

Figure 41:
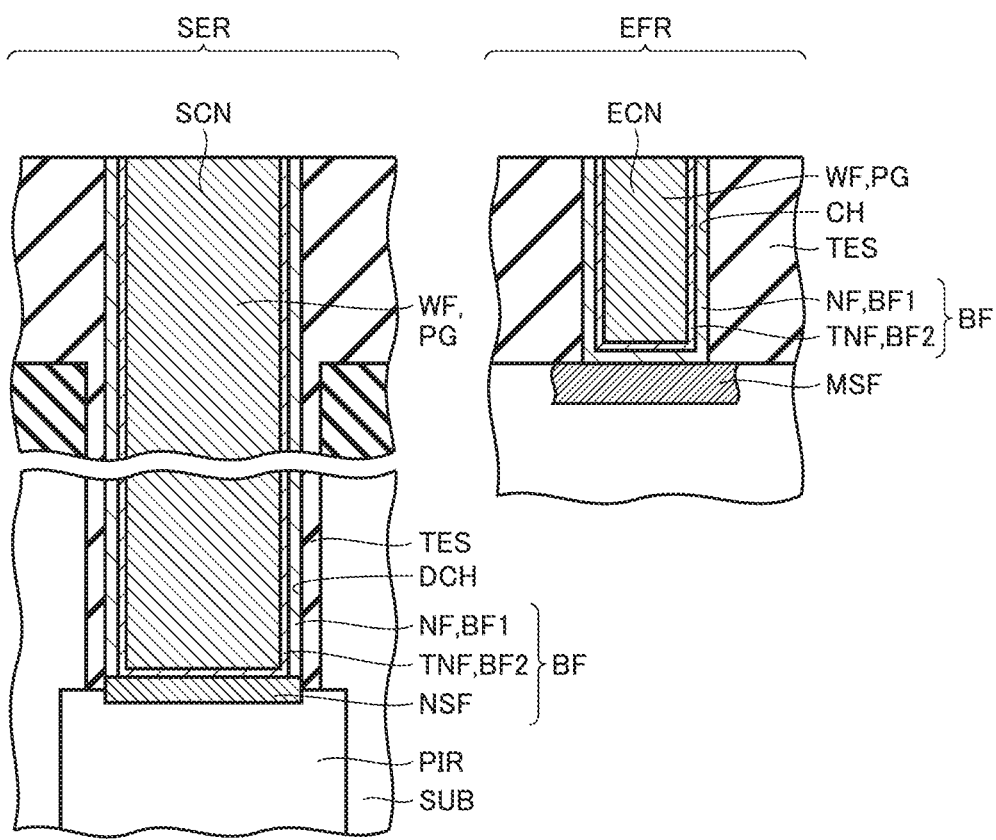
FIG. 41 is a fragmentary enlarged cross-sectional view showing a step performed after the step shown in FIG. 40 in the same embodiment.
Figure 42:
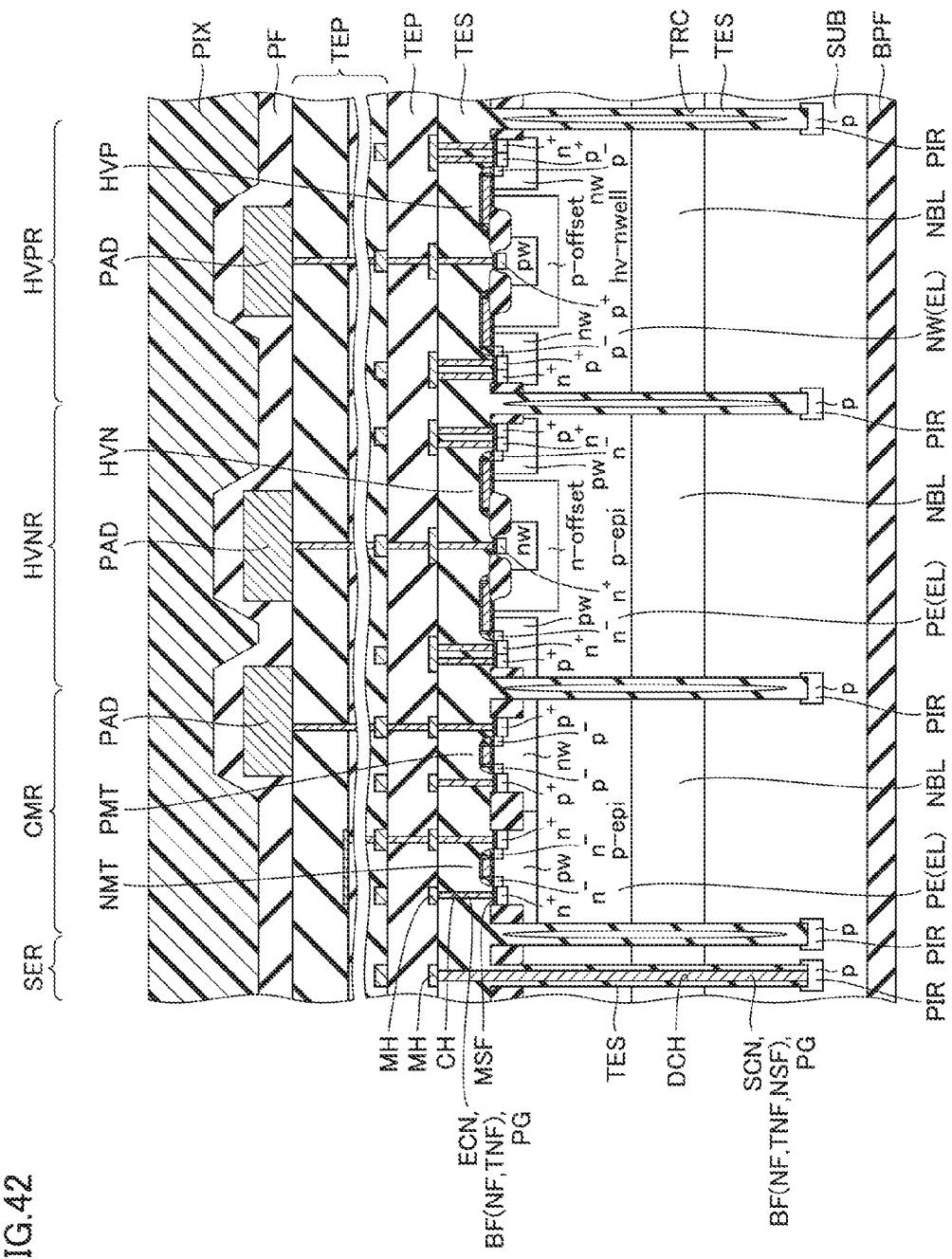
FIG. 42 is a cross-sectional view showing a step performed after the step shown in FIG. 41 in the same embodiment.

Then, a chemical mechanical polishing process is performed. Consequently, as shown in FIG. 41, in shallow contact hole CH, element contact portion ECN is formed of the remaining portions of nickel film NF, titanium nitride film TNF and tungsten film WF. In deep contact hole DCH, substrate contact portion SCN is formed of the remaining portions of nickel film NF, nickel silicide film NSF, titanium nitride film TNF and tungsten film WF (see step S9 in FIG. 35). Subsequently, similar steps to the steps shown in FIGS. 22 and 23 are performed, to thereby complete the substantial part of the semiconductor device as shown in FIG. 42.

The inventor made various evaluations of a nickel film as with a titanium film, and discovered a method forming substrate contact portion SCN and element contact portion ECN by forming barrier metal film BF including nickel film NF simultaneously under the same conditions, as shown in FIG. 35, in contact hole CH at which the metal silicide is exposed and contact hole DCH at which the silicon (semiconductor substrate SUB) is exposed.

The structures of substrate contact portion SCN and element contact portion ECN thus formed are now described.

Figure 43:
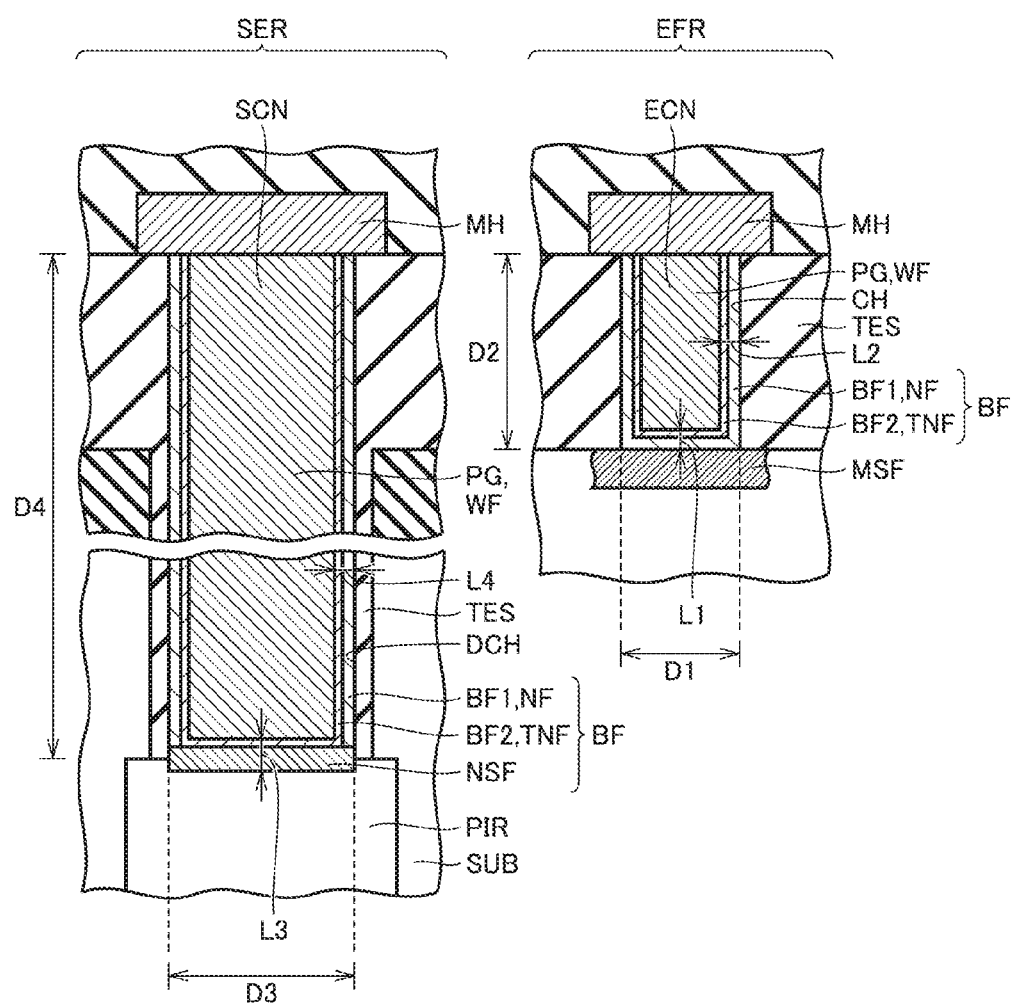
FIG. 43 is a fragmentary enlarged cross-sectional view showing the substrate contact portion and the element contact portion in order to illustrate the features of the barrier metal film in the same embodiment.

As shown in FIG. 43, in element contact portion ECN (D1: about 0.08 μm, D2: about 0.5 μm, aspect ratio (D2/D1): about 6.25), a film thickness L1 of barrier metal film BF located at the bottom surface is about 25 nm (nickel film NF (15 nm)+titanium nitride film TNF (10 nm)). A film thickness L2 of barrier metal film BF located at the side surface is about 25 nm (nickel film NF (15 nm)+titanium nitride film TNF (10 nm)). Thus, a ratio A of film thickness L1 to film thickness L2 (film thickness L1/film thickness L2) is 1.

In contrast, in substrate contact portion SCN (D3: about 0.5 μm, D4: about 15 μm, aspect ratio (D4/D3): about 30), a film thickness L3 of barrier metal film BF located at the bottom surface is about 40 nm (nickel silicide film NSF (30 nm)+titanium nitride film TNF (10 nm)). A film thickness L4 of barrier metal film BF located at the side surface is about 25 nm (nickel film NF (15 nm)+titanium nitride film TNF (10 nm)). Thus, a ratio B of film thickness L2 to film thickness L4 (film thickness L2/film thickness L4) is 1.6

Accordingly, it was found that a relation of ratio A (1)<ratio B (1.6) held in this case. It is noted that the values of the film thicknesses of the barrier metal film and the like listed here are merely exemplary and the thicknesses are not limited to these values.

Each of the above embodiments has been described with reference to the example where, as the depths of the contact holes, depth D2 of shallow contact hole CH in which element contact portion ECN is formed is about 0.5 μm while depth D4 of deep contact hole DCH in which substrate contact portion SCN is formed is about 15 μm.

It was found by the inventor that the substrate contact portion and the element contact portion could be simultaneously formed by applying each of the methods described above, for a semiconductor device in which the depth of deep contact hole DCH is five times or more (at least five times) deeper than the depth of shallow contact hole CH.

In addition, the description has been given with reference to the example where, as the aspect ratio of the contact hole, in particular, the aspect ratio of deep contact hole DCH (D4/D3) is about 30.

It was found by the inventor that the substrate contact portion and the element contact portion could be simultaneously formed by applying each of the methods described above, for a semiconductor device in which the aspect ratio of deep contact hole DCH (D4/D3) is 10 or more (at least 10).

Moreover, while a tungsten plug has been described as an example of the plug, a copper plug may be applied. When a copper plug is to be applied, a titanium film may be applied as the first barrier metal film, a tantalum nitride (TaN) film may be applied as the second barrier metal film, and a ruthenium (Ru) film may be applied as a seed layer, for example.

The semiconductor device and the like described in the embodiments can be combined in various ways as needed.

While the invention made by the present inventor has been specifically described above based on the embodiments, it goes without saying that the present invention is not limited to the embodiments described above, but can be modified in various ways without departing from the substance of the invention.

The second and third embodiments described above include the following modes:

(Aspect 1) A method of manufacturing a semiconductor device, comprising the steps of:

forming a metal silicide film over a semiconductor substrate;

forming an interlayer insulating film over the semiconductor substrate to cover the metal silicide film;

forming a first contact hole of a first depth, the first contact hole penetrating the interlayer insulating film and reaching the metal silicide film;

forming a second contact hole of a second depth deeper than the first depth, the second contact hole penetrating the interlayer insulating film and reaching the semiconductor substrate;

forming a barrier metal film in each of the first contact hole and the second contact hole; and forming a plug to fill each of the first contact hole and the second contact hole, the step of forming a barrier metal film including the steps of forming a first barrier metal film, and forming a second barrier metal film so as to be in contact with the first barrier metal film, in the step of forming a first barrier metal film, a metal film being formed using an organic source as a source material, in the step of forming a second barrier metal film, a metal nitride film being formed.

(Aspect 2) The method of manufacturing a semiconductor device according to Aspect 1, wherein the step of forming a barrier metal film includes the step of, before the step of forming a first barrier metal film, carrying out pretreatment by either sputter etching or chemical dry cleaning on the first contact hole and the second contact hole.

(Aspect 3) The method of manufacturing a semiconductor device according to Aspect 1, wherein in the step of forming a first barrier metal film, a cobalt film is formed as the metal film, the step of forming a first barrier metal film includes the step of forming a cobalt silicide film as a third barrier metal film at a bottom of the second contact hole, by forming the cobalt film under such temperature conditions that temperature is higher than temperature at which cobalt silicide is formed and lower than temperature at which the metal silicide film agglomerates, and in the step of forming a second barrier metal film, a titanium nitride film is formed as the metal nitride film.

(Aspect 4) The method of manufacturing a semiconductor device according to Aspect 1, wherein in the step of forming a first barrier metal film, a nickel film is formed as the metal film, the step of forming a first barrier metal film includes the step of forming a nickel silicide film as a third barrier metal film at a bottom of the second contact hole, by forming the nickel film under such temperature conditions that temperature is higher than temperature at which nickel silicide is formed and lower than temperature at which the metal silicide film agglomerates, and in the step of forming a second barrier metal film, a titanium nitride film is formed as the metal nitride film.

(Aspect 5) The method of manufacturing a semiconductor device according to Aspect 1, wherein in the step of forming a second contact hole, the second contact hole is formed such that the second depth of the second contact hole is five times or more deeper than the first depth of the first contact hole.

(Aspect 6) The method of manufacturing a semiconductor device according to Aspect 1, wherein assuming that a ratio of the second depth to an opening dimension of a bottom portion of the second contact hole is an aspect ratio, in the step of forming a second contact hole, the second contact hole is formed such that the aspect ratio is 10 or greater.

(Aspect 7) The method of manufacturing a semiconductor device according to Aspect 1, wherein in the step of forming a plug, a tungsten plug is formed.

What is claimed is:

1. A method of manufacturing a semiconductor device, comprising the steps of:

forming a metal silicide film over a semiconductor substrate;

forming an interlayer insulating film over the semiconductor substrate to cover the metal silicide film;

forming a first contact hole of a first depth, the first contact hole penetrating the interlayer insulating film and reaching the metal silicide film;

forming a second contact hole of a second depth deeper than the first depth, the second contact hole penetrating the interlayer insulating film and reaching the semiconductor substrate;

forming a barrier metal film in each of the first contact hole and the second contact hole; and forming a plug to fill each of the first contact hole and the second contact hole, wherein the step of forming a barrier metal film includes the steps of forming a first barrier metal film, and forming a second barrier metal film so as to be in contact with the first barrier metal film, wherein the step of forming a first barrier metal film includes the steps of supplying a mixed gas of titanium tetrachloride ($TiCl_4$) and hydrogen ($H_2$) under such conditions that partial pressure of the titanium tetrachloride is 3 Pa or higher and the product of the partial pressure of the titanium tetrachloride and supply time is greater than 800 Pa·second, and forming a titanium film as the first barrier metal film in a plasma atmosphere using an inorganic source of titanium as a source material, wherein in the step of forming a second barrier metal film, a metal nitride film is formed.

2. The method of manufacturing a semiconductor device according to claim 1, wherein the step of forming a barrier metal film includes the step of, before the step of forming a first barrier metal film, carrying out pretreatment by either sputter etching or chemical dry cleaning on the first contact hole and the second contact hole.

3. The method of manufacturing a semiconductor device according to claim 1, wherein the step of forming a first barrier metal film includes the step of forming a titanium silicide film as a third barrier metal film at a bottom of the second contact hole, by forming the titanium film under such conditions that temperature is higher than temperature at which titanium silicide is formed and lower than temperature at which the metal silicide film agglomerates.

4. The method of manufacturing a semiconductor device according to claim 1, wherein in the step of forming a second contact hole, the second contact hole is formed such that the second depth of the second contact hole is five times or more deeper than the first depth of the first contact hole.

5. The method of manufacturing a semiconductor device according to claim 1, wherein assuming that a ratio of the second depth to an opening dimension of a bottom portion of the second contact hole is an aspect ratio, in the step of forming a second contact hole, the second contact hole is formed such that the aspect ratio is 10 or greater.

6. The method of manufacturing a semiconductor device according to claim 1, wherein in the step of forming a plug, a tungsten plug is formed.

7. The method of manufacturing a semiconductor device according to claim 2, wherein the step of carrying out pretreatment is performed in a first chamber, the step of forming a first barrier metal film is performed in a second chamber different from the first chamber, and the step of forming a second barrier metal film is performed in a third chamber different from the first chamber and the second chamber.

* * * * *